United States Patent
Lee

(10) Patent No.: US 8,144,514 B2
(45) Date of Patent: Mar. 27, 2012

(54) ONE-TRANSISTOR FLOATING-BODY DRAM CELL DEVICE WITH NON-VOLATILE FUNCTION

(75) Inventor: Jong-Ho Lee, Daegu (KR)

(73) Assignee: SNU R&DB Foundation (KR)

( * ) Notice: Subject to any disclaimer, the term of this patent is extended or adjusted under 35 U.S.C. 154(b) by 568 days.

(21) Appl. No.: 12/292,427

(22) Filed: Nov. 19, 2008

(65) Prior Publication Data

US 2009/0147580 A1 Jun. 11, 2009

(30) Foreign Application Priority Data

Nov. 20, 2007 (KR) .................. 10-2007-0118227

(51) Int. Cl.
  *G11C 11/34* (2006.01)
  *G11C 14/00* (2006.01)
(52) U.S. Cl. ......... 365/185.08; 365/185.01; 365/185.18; 365/149; 257/298
(58) Field of Classification Search .......... 257/E27.084, 257/296, 298; 365/185.01, 185.08, 149, 365/185.18
  See application file for complete search history.

(56) References Cited

U.S. PATENT DOCUMENTS

| 6,054,734 A * | 4/2000 | Aozasa et al. ........... 257/315 |
| 6,538,916 B2 * | 3/2003 | Ohsawa .................. 365/149 |
| 7,202,521 B2 * | 4/2007 | Kim et al. ............... 257/314 |
| 7,239,549 B2 | 7/2007 | Fazan et al. |
| 7,285,821 B2 | 10/2007 | Smith |
| 2004/0160816 A1 | 8/2004 | Yoo et al. |
| 2006/0220085 A1 | 10/2006 | Huo et al. |
| 2007/0138555 A1 | 6/2007 | Bhattacharyya |
| 2008/0048239 A1 * | 2/2008 | Huo et al. ............... 257/315 |
| 2010/0102372 A1 * | 4/2010 | Lee et al. ............... 257/298 |
| 2010/0207180 A1 * | 8/2010 | Lee ....................... 257/296 |

FOREIGN PATENT DOCUMENTS

KR  10-2009-0021744  3/2009

OTHER PUBLICATIONS

Charles Kuo, et al., "A Capacitorless Double Gate DRAM Technology for Sub-100-nm Embedded and Stand-Alone Memory Applications," IEEE Transactions on Electron Devices, Dec. 2003, pp. 2408-2416, vol. 50, No. 12.

* cited by examiner

*Primary Examiner* — VanThu Nguyen
(74) *Attorney, Agent, or Firm* — Cantor Colburn LLP

(57) ABSTRACT

The 1T floating-body DRAM cell device includes a floating body for storing information of the DRAM cell device, a source and a drain formed on respective sides of the floating body, a gate insulating layer formed on a top of the floating body, a gate electrode formed on a top of the gate insulating layer, a gate stack formed under the floating body and configured to have a charge storage node for storing electric charges, and a control electrode formed on a lower side of the gate stack or partially or completely surrounded by the gate stack. The DRAM cell device performs "write0" and "write1" operations or a read operation. The DRAM cell device performs a non-volatile program operation or a non-volatile erase operation.

21 Claims, 20 Drawing Sheets

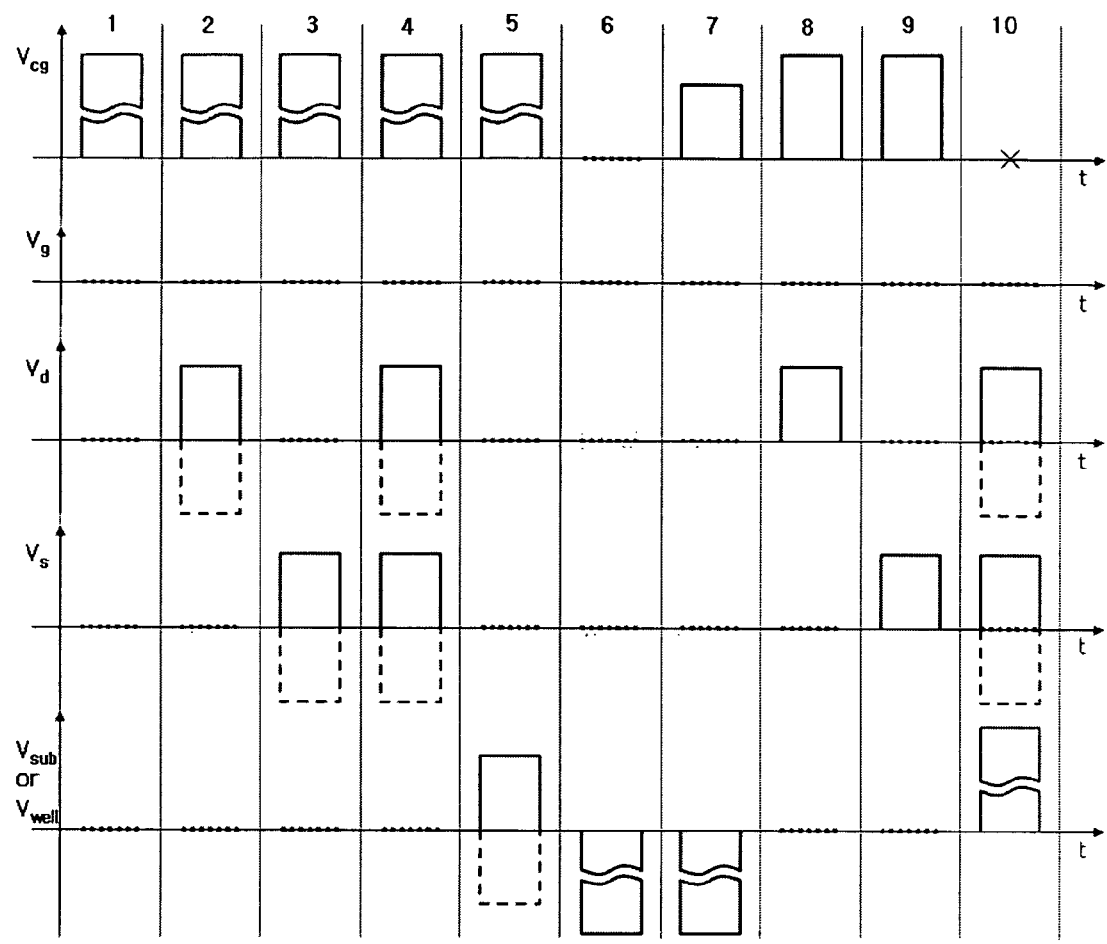

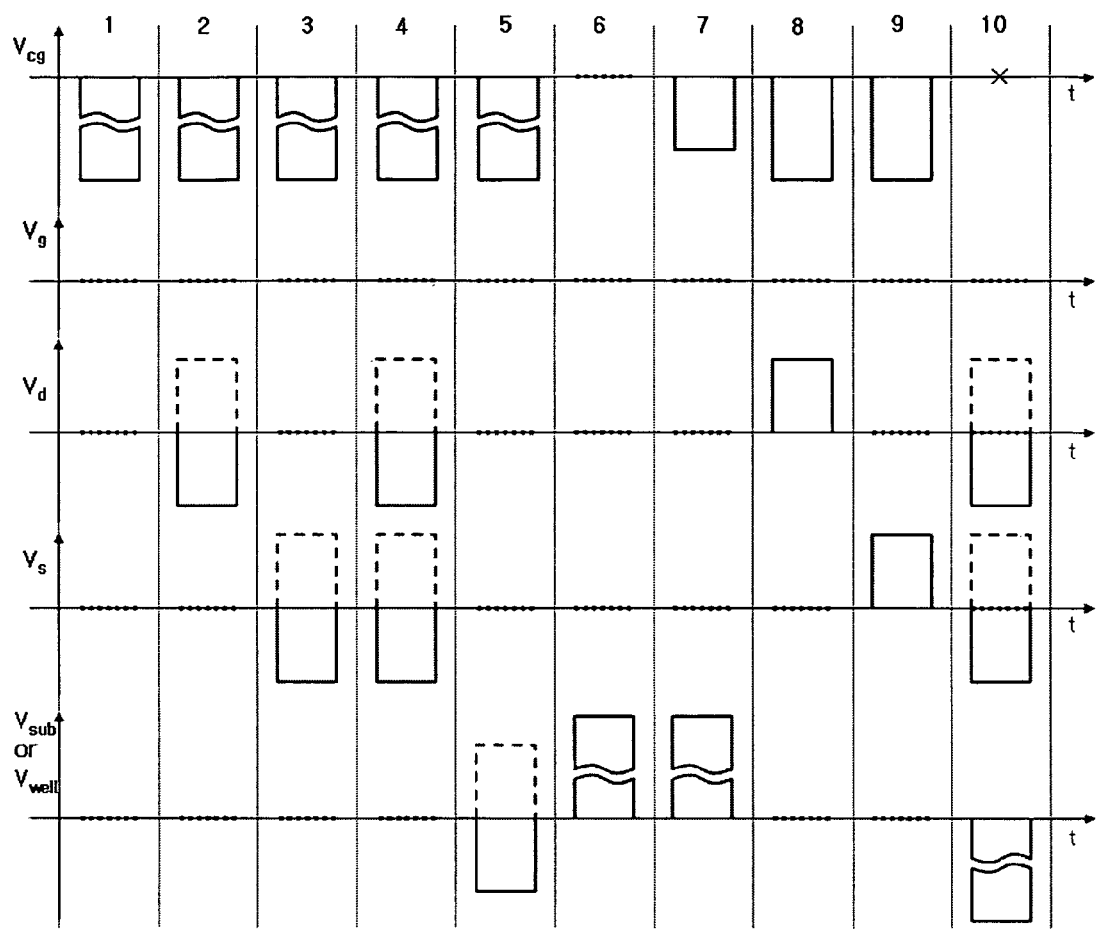

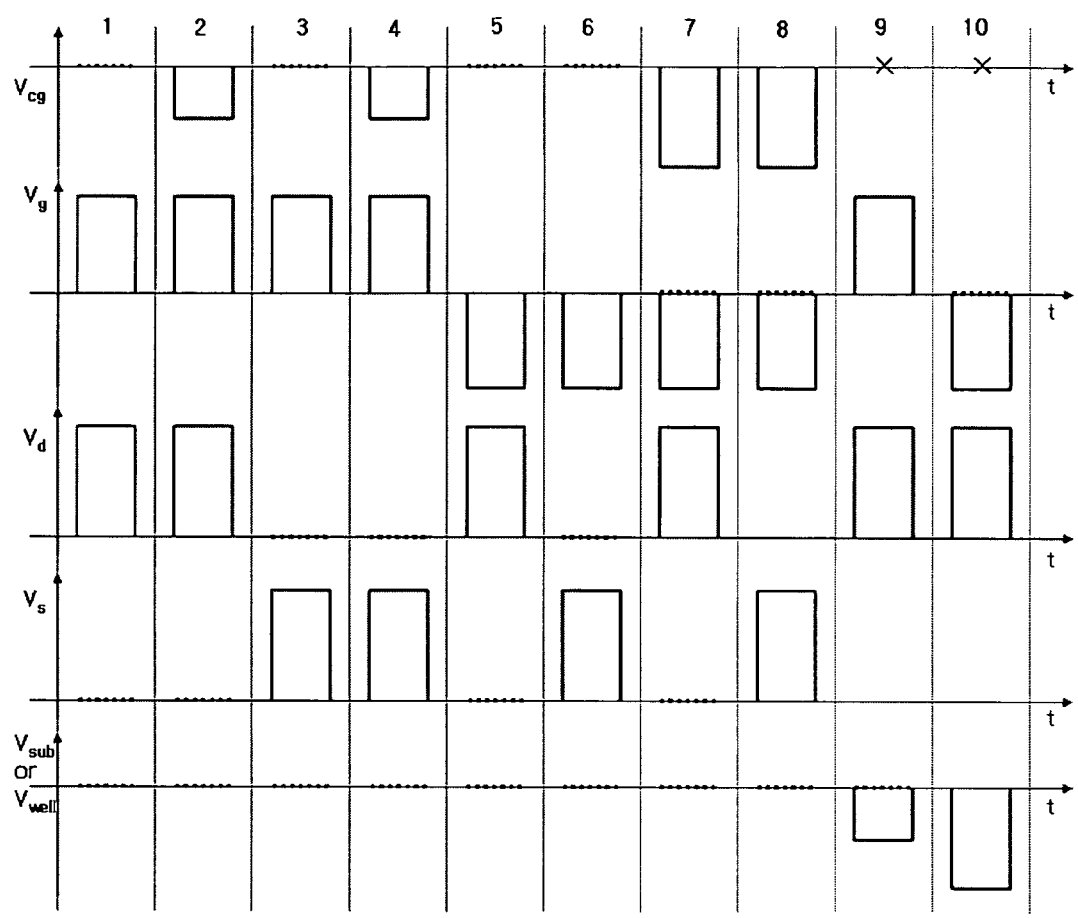

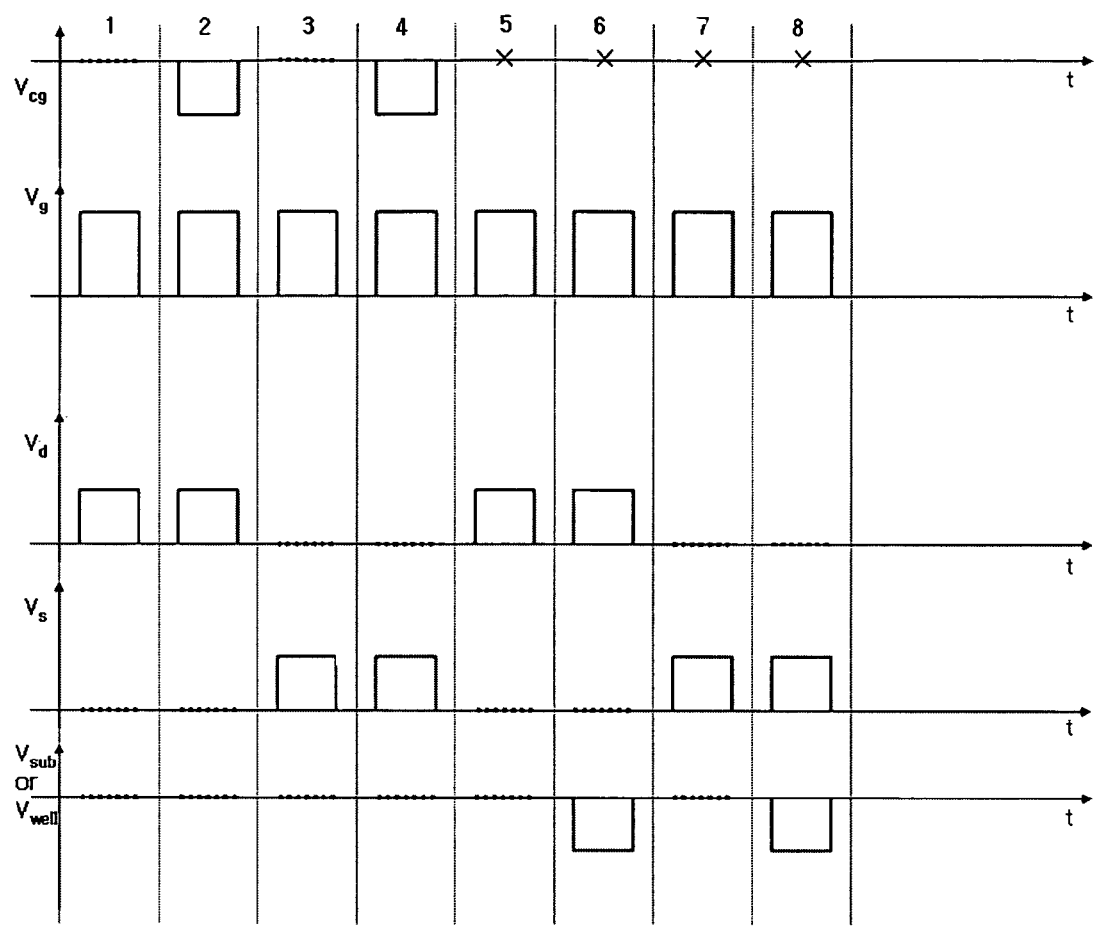

ONE-TRANSISTOR FLOATING-BODY DRAM CELL DEVICE WITH NON-VOLATILE FUNCTION

CROSS-REFERENCE TO RELATED PATENT APPLICATION

This application claims the benefit of Korean Patent Application No. 10-2007-0118227, filed on Nov. 20, 2007, in the Korean Intellectual Property Office, the disclosure of which is incorporated herein in its entirety by reference.

BACKGROUND OF THE INVENTION

1. Field of the Invention

The present invention relates generally to a one-transistor (hereinafter referred to as '1T') floating-body DRAM cell device with a non-volatile function, and, more particularly, to a 1T floating-body DRAM cell device that can improve device performance and characteristic distribution by providing an operation method having a non-volatile function to an 1T floating-body DRAM cell device having a dual gate structure.

2. Description of the Related Art

An existing DRAM cell device is constructed with one MOS transistor and one cell capacitor. Recently, as a degree of integration in a DRAM is increasingly required, a size of a cell device needs to be reduced, and a size of a cell capacitor needs to be reduced. Such a miniaturization of the cell device and the cell capacitor in the MOS device requires very difficult manufacturing processes. Recently, MOS devices having a floating body have been as DRAM cell devices. In the devices, DRAM memory operations may be performed by storing or removing charges in the floating body. In this technology, since one MOS cell device is used, the DRAM can be implemented by using simple processes unlike the conventional DRAM. Such a DRAM cell device is referred to as a 1T floating-body DRAM cell device (hereinafter, simply referred to as a 1T DRAM cell device or a 1T-DRAM cell device). The 1T DRAM cell device can be adapted to an existing DRAM. In addition, the 1T DRAM cell device can be embedded in an existing logic circuit (for example, a microprocessor or a network-processor). In this case, the 1T DRAM cell device is called as an eDRAM cell device. The 1T DRAM cell device used in the eDRAM has a high memory capacity or a high operating speed, so that its applications are increased. The 1T DRAM cell device has a floating body. The adjacent floating bodies are electrically isolated from each other so as to be floated. Information is stored in the floating body. Therefore, unlike a conventional DRAM cell device, in the 1T DRAM cell device, no cell capacitor is required. As a result, a cell area can be reduced, and a degree of integration of the DRAM cell devices can be improved.

FIG. 1A shows a conventional 1T DRAM cell device which is implemented on an SOI (Silicon On Insulator) substrate. The SOI substrate is a single-crystalline silicon film where a substrate 1, a buried insulating layer 2, a source 8, a drain 9, and a floating body 3 are formed. The source 8 and the drain 9 are disposed at both sides of the floating body 3. A gate insulating layer 10 is formed on the silicon film, and a gate electrode 11 is disposed on the gate insulating layer.

FIG. 1B shows a conventional 1T DRAM cell device. The DRAM cell device has a lower gate electrode 21 being formed in the fifth insulating layer 20 and the fifth insulating layer 20 is formed on the substrate 1. The source 8 and the drain 9 are disposed at both sides of the floating body 3, and a gate insulating layer 10 and a gate electrode 11 are formed on the silicon film.

Next, the operation bias condition of the conventional one-transistor DRAM cell in FIG. 1 is described in FIG. 2. The operation method for the 1T DRAM cell device is disclosed in U.S. Pat. No. 7,239,549. The write1 operation due to the collision ionization method is described in FIG. 2A and the write1 operation due to the GIDL (Gate Induced Drain Leakage) in FIG. 2B.

Since the miniaturization of device leads to an increase in capacity of DRAM, it is very important. However, due to the miniaturization of channel length, a short channel effect occurs. In addition, a size of a floating body which stores information is reduced, so that a difference in drain current between the write1 state and the write0 state is decreased. Accordingly, it is difficult to sense and to store information for a long time.

In order to solve the problem, 1T DRAM cell devices having a double-gate structure that is effective in the miniaturization of device have been proposed. Hereinafter, the representative structure among the proposed double-gate structures will be described in detail.

FIG. 1B shows an example of a conventional 1T DRAM cell device published in UC Berkeley (Charles Kuo et al, "A Capacitor-less Double Gate DRAM Technology for Sub-100-nm Embedded and Stand-Alone Memory Applications," IEEE Trans. on Electron Devices, vol. 50, no. 12, pp. 2408-2416, 2003). In the example, an upper gate 11 and a lower gate 21 are disposed on and under a floating body 3, respectively, so that the upper gate 11 and the lower gate 25 are electrically independent of each other. In the 1T DRAM cell device, due to the characteristics of the double-gate structure, it is possible to suppress the short channel effect and to improve the sensing margin. In the cell device, a negative voltage (for example, −1 V) is applied to the lower gate 25, so that the holes can be held in the floating body 3 in the write1 operation for a long time. In addition, during the write0 operation, a voltage of 0 V is applied to the lower gate 25, so that the holes in the floating body 3 can be effectively flown into a drain region. Accordingly, it is possible to improve the sensing margin. However, the 1T DRAM cell device has the problems as follows. Generally, in a case where the floating body 3 in the double-gate structure has a small thickness and is completed depleted, a width of the body needs to be small so as to suppress the short channel effect. A threshold voltage of the double-gate device having a fully depleted body depends on the thickness of the body and a doping concentration of the body. Although a fully depleted device is actually manufactured, a dispersion of the threshold voltages among the cell devices is too large, so that it is difficult to implement a practical device. In addition, the lower gate electrode 25 needs to be independently provided to each cell device, there is a problem in that a degree of integration of cell devices is greatly decreased in a layout of a cell array of the cell devices.

An example of a structure for solving the above-described problems is disclosed in Korean Patent Application No. 2007-0086516. Since this device structure includes a dual gate structure as described above, it is advantageous for reduction in size. The principal characteristic of this device structure lies in the fact that a gate stack (a tunneling insulating layer, a storage node, and a blocking insulating layer) for storing electric charges and a control electrode are formed on either side of a floating body, thereby enabling a non-volatile function without decreasing the degree of integration. This Korean patent is configured to reduce the characteristic distribution of a device, which may be generated when a fully depleted thin body indispensable for reduction in size is employed, using the non-volatile function. This Korean patent claims examples of a structure and a fabrication method. Accordingly, the present invention provides a device structure with a focus on a variety of operation methods that can be used when the above-described device is applied as a 1T-DRAM cell device.

SUMMARY OF THE INVENTION

Accordingly, the present invention has been made keeping in mind the above problems occurring in the prior art, and an object of the present invention is to provide a dual gate 1T-DRAM cell with a non-volatile function, which is capable of improving the sensing margin between "write1" and "write0" and the retention characteristic in the operation of the 1T-DRAM cell.

Another object of the present invention is to provide a 1T-DRAM cell having an operation method, which is capable of reducing the threshold voltage distribution of the cell device using a non-volatile memory function.

Still another object of the present invention is to provide a method of forming such 1T-DRAM cell devices in array form and operating the array using the non-volatile function on a module basis.

In order to accomplish the above objects, the present invention provides a 1T floating-body DRAM cell device having a dual gate structure, the 1T floating-body DRAM cell device including a floating body for storing information of the DRAM cell device; a source and a drain formed on respective sides of the floating body; a gate insulating layer formed on a top of the floating body; a gate electrode formed on a top of the gate insulating layer; a gate stack formed under the floating body and configured to have a charge storage node for storing electric charges; and a control electrode formed on a lower side of the gate stack or partially or completely surrounded by the gate stack; wherein the DRAM cell device performs "write0" and "write1" operations for storing information in the floating body or a read operation for reading information stored in the floating body; and wherein the DRAM cell device performs a non-volatile program operation for storing electric charges in the charge storage node of the gate stack or a non-volatile erase operation for erasing electric charges stored in the gate stack.

According to another aspect of the present invention, the present invention provides a 1T floating-body DRAM cell device having a dual gate structure, the 1T floating-body DRAM cell device including a floating body for storing information of the DRAM cell device; a source and a drain respectively formed on top and bottom surfaces of the floating body; a gate insulating layer formed on a side of the floating body; a gate electrode formed on a side of the gate insulating layer; a gate stack formed on a side of the floating body and configured to have a charge storage node for storing electric charges, the stack gate being formed on a side opposite to the side on which the gate electrode is formed; and a control electrode formed on a side of the gate stack or partially or completely surrounded by the gate stack; wherein the DRAM cell device performs "write0" and "write1" operations for storing information in the floating body or a read operation for reading information stored in the floating body; and wherein the DRAM cell device performs a non-volatile program operation for storing electric charges in the gate stack or a non-volatile erase operation for erasing electric charges stored in the gate stack.

Preferably, the gate stack is formed to partially or completely surround the control electrode on a semiconductor substrate and further includes a substrate electrode for applying voltage to the semiconductor substrate, and voltage of the substrate electrode is controlled during the non-volatile program operation or non-volatile erase operation on the gate stack or the "write0", "write1" and read operation on the floating body. Here, the non-volatile program operation and the non-volatile erase operation may be performed using one selected from the group consisting of a Fowler-Nordheim (FN) method, a hot electron injection method, and a hot hole injection method or a combination thereof.

The 1T floating-body DRAM cell device may perform the non-volatile program operation or the non-volatile erase operation by controlling voltage of the control electrode before and after or during the "write0," "write1" and "read" operations on the floating body.

The 1T floating-body DRAM cell device may store information about "write1" and "write0" stored in the floating body in the charge storage node of the gate stack as non-volatile information by performing the non-volatile program operation and the non-volatile erase operation.

The 1T floating-body DRAM cell device is characterized in that after the non-volatile program operation or the non-volatile erase operation have been performed, a preset voltage is uniformly applied to the control electrode during a DRAM operation "write" or "read". It is preferred that the applied voltage is 0 V, negative (−) or positive (+) DC voltage, or voltage in pulse form.

Preferably, when performing the non-volatile program operation and the non-volatile erase operation by applying a preset voltage to the control electrode, the 1T floating-body DRAM cell device controls the polarity and magnitude of the electric charges stored in the charge storage node by adjusting the polarity, magnitude and duration of the voltage applied to the control electrode.

When the charge storage node of the gate stack is formed of a insulating thin film or nano-sized dots, the 1T floating-body DRAM cell device may locally store non-volatile information in the charge storage node by performing the non-volatile program operation or the non-volatile erase operation using a hot carrier method.

When the control electrode exists in a floating state, the 1T floating-body DRAM cell device may perform the non-volatile program operation and the non-volatile erase operation by controlling voltage applied to the substrate electrode or voltage applied to a well additionally formed in the substrate. It is preferred that the 1T floating-body DRAM cell device perform the non-volatile program operation and the non-volatile erase operation by controlling voltage applied to the control electrode and the substrate electrode or voltage applied to the control electrode and a well additionally formed in the substrate. The 1T floating-body DRAM cell device may perform the non-volatile program operation and the non-volatile erase operation by controlling voltage applied to one or two or more of the source, the drain, and the substrate while applying voltage to the control electrode. The 1T floating-body DRAM cell device is characterized in that the semiconductor substrate further includes a well-shaped well electrode and the well electrode is electrically isolated from the semiconductor substrate, and may apply voltage to the semiconductor substrate through the well electrode during the non-volatile program operation and the non-volatile erase operation on the gate stack or a program operation and a read operation on the DRAM.

In the 1T floating-body DRAM cell device, the "write1" operation for storing information corresponding to "write1" in the floating body may be performed by applying a voltage, preset to a value corresponding to "write1", to the gate electrode and the drain, a voltage, preset to a value corresponding to "write1", to the control electrode and the drain, or a voltage, preset to value corresponding to "write1", to the gate electrode, the control electrode and the drain. The "write0" operation for storing information corresponding to "write0" in the floating body may be performed by applying a voltage, preset to a value corresponding to "write0", to the gate electrode and the drain, a voltage, preset to a value corresponding to "write0", to the control electrode and the drain, a voltage, preset to a value corresponding to "write0", to the gate electrode, the control electrode, and the drain, or a voltage, preset to a value corresponding to "write0", to the source. The read operation for reading the information stored in the floating body may be performed by applying voltage, preset to a value corresponding to "read", to the gate electrode and the drain, a voltage, preset to a value corresponding to "read", to the control electrode and the drain, or voltage, preset to a value corresponding to "read", to the gate electrode, the control electrode, and the drain.

The 1T floating-body DRAM cell device is characterized in that the gate electrode, and the source/drain are formed so that the gate electrode does not overlap the source/drain, and it is preferred that the "write1" operation performed on the floating body be performed by controlling voltage of the gate electrode and the drain so that impact ionization is generated in a region between an outside of a channel of the device and the drain. The non-volatile program operation and the non-volatile erase operation of the 1T floating-body DRAM cell device may be performed by injecting or removing electric charges into or from the charge storage node of the gate stack through one of the source and the drain, or simultaneously injecting or removing electric charges into or from the charge storage node of the gate stack through the source and the drain. The control electrode of the 1T floating-body DRAM cell device is partially or completely surrounded by the gate stack, and does not overlap one of the source and the drain or both the source and the drain.

According to still another aspect of the present invention provide a DRAM cell array having 1T floating-body DRAM cell devices that are repeatedly arranged in rows and columns. The DRAM cell array includes word lines configured to connect the gate electrodes of the DRAM cell devices, bit lines configured to connect the drain electrodes of the DRAM cell devices, and control electrode lines configured to connect the control electrodes of the DRAM cell devices, and the control electrode lines are arranged in parallel to the word lines or the bit lines.

Preferably, each of the DRAM cell devices constituting the DRAM cell array further includes a well-shaped well electrode, which is electrically isolated from a substrate, in the substrate, and the well electrode of each of the DRAM cell devices constituting the DRAM cell array is connected to well electrodes of DRAM cell devices arranged in rows or columns.

BRIEF DESCRIPTION OF THE DRAWINGS

The above and other objects, features and advantages of the present invention will be more clearly understood from the following detailed description taken in conjunction with the accompanying drawings, in which:

FIGS. 10 to 14 are diagrams showing examples of the bias conditions for the operation of the 1T-DRAM cell device with the non-volatile function according to the present invention. In the drawings, $V_{cg}$ denotes control gate voltage, $V_g$ denotes gate voltage, $V_d$ denotes drain voltage, and $V_{sub}$ denotes substrate voltage. FIG. 10 shows an example of a program bias condition for the non-volatile function, FIG. 11 shows an example of an erase bias condition for the non-volatile function, FIG. 12 shows an example of a bias condition for "write1", FIG. 13 shows an example of a bias condition for "read", and FIG. 14 shows an example of a bias condition for "write0";

DESCRIPTION OF THE PREFERRED EMBODIMENTS

Figure 1A:
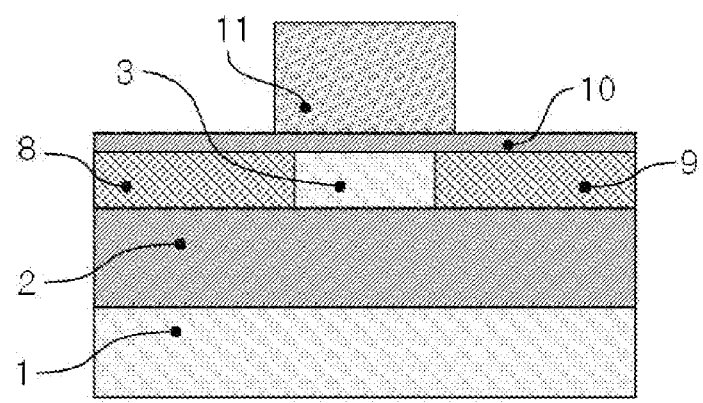
FIGS. 1A and 1B are sectional views showing a conventional 1T-DRAM device and a 1T-DRAM device having a dual gate structure.
Figure 1B:
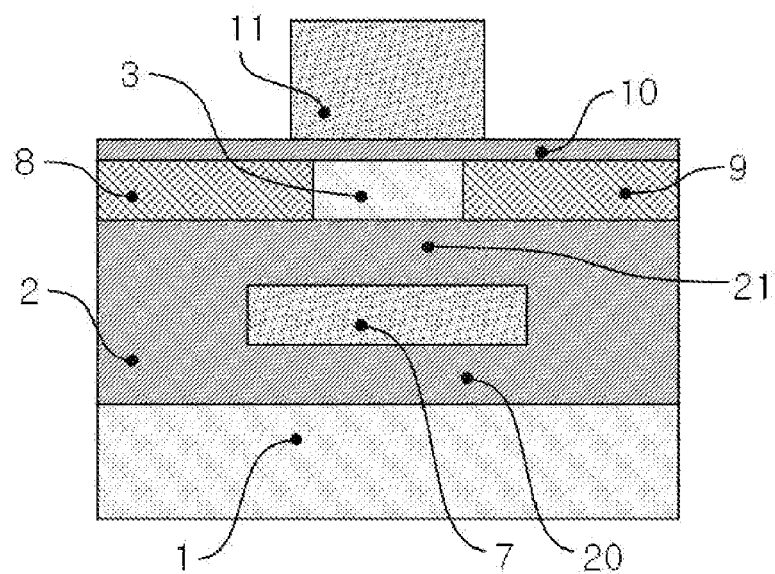
Figure 2A:
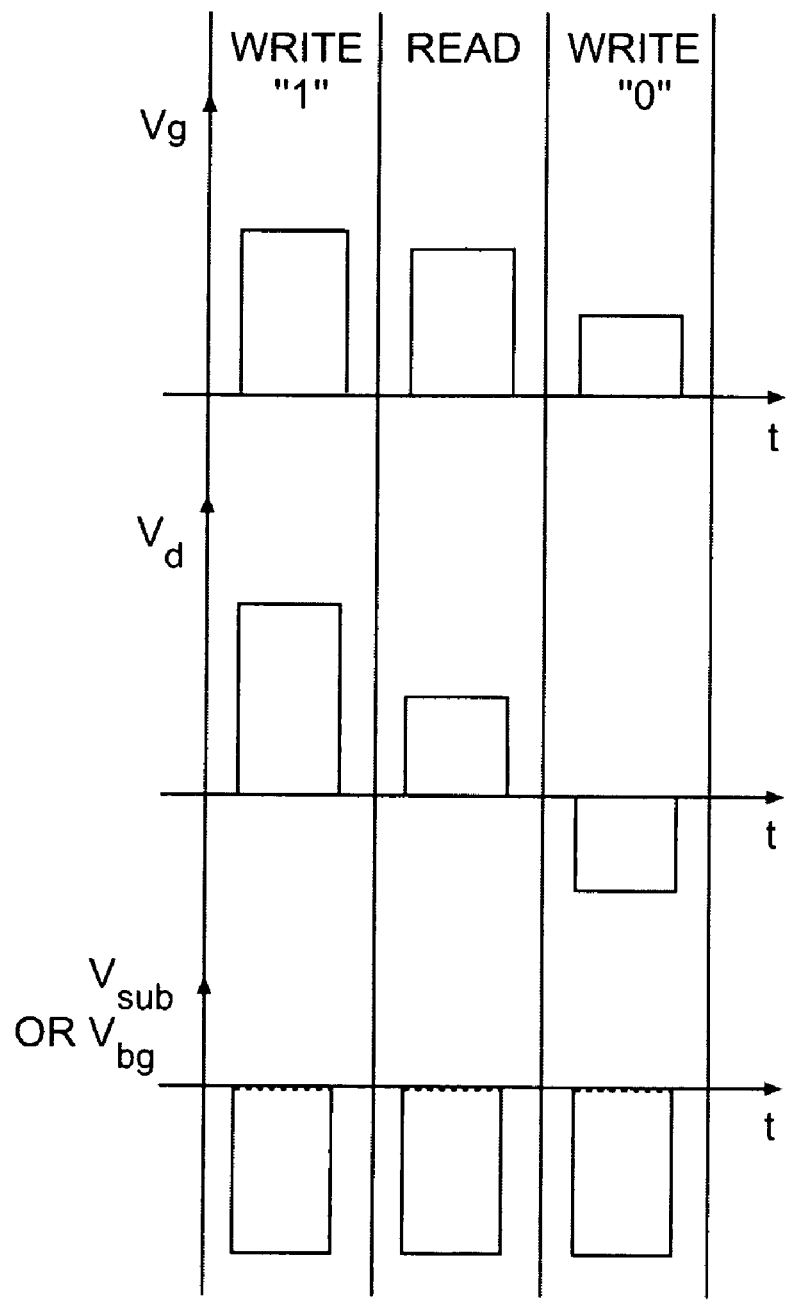
FIGS. 2A and 2B are diagrams showing voltage waveforms in pulse form, which are provided for the operation of the conventional 1T-DRAM cell shown in FIG. 1. In these drawings, $V_g$ denotes gate voltage, $V_d$ denotes drain voltage, $V_{sub}$ denotes substrate voltage, and $V_{bg}$ denotes back-gate voltage that is the same as that in a region 7 shown in FIG. 1B. Three waveform conditions, as indicated by 1, 2, and 3, are applied to the voltage waveform $V_{sub}$ or $V_{bg}$.
Figure 2B:
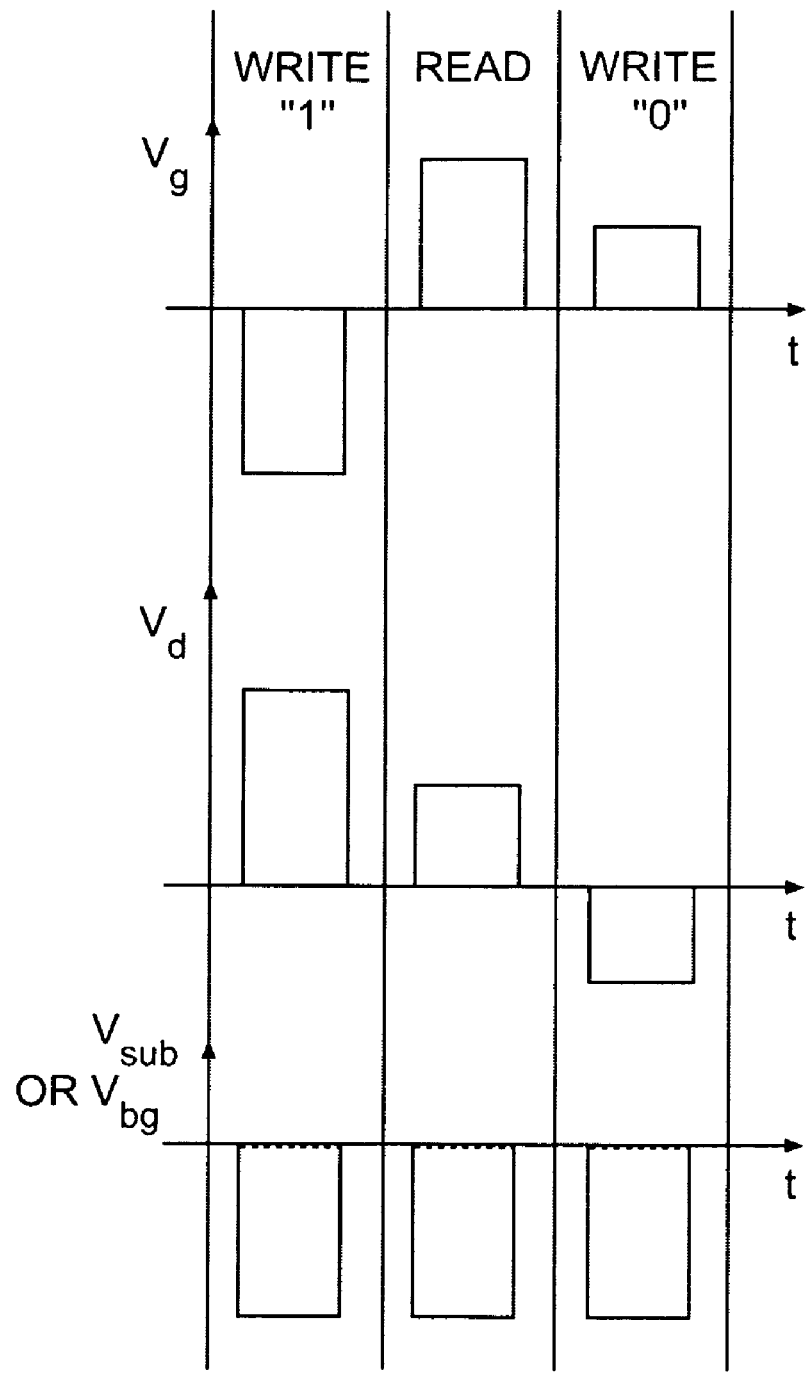

Reference now should be made to the drawings, in which the same reference numerals are used throughout the different drawings to designate the same or similar components.

The present invention provides a device in which a gate electrode for a MOSFET operation and a control electrode for a non-volatile memory operation are formed on respective sides of a thin silicon layer in which a source, a drain and a floating body are formed, and a method of operating an array in which such devices are arranged.

Prior to a detailed description of the construction of the operation method of the present invention, the construction of a basic method of operating a 1T-DRAM cell with a non-volatile function and the device symbol of the 1T-DRAM cell are described first. Furthermore, the structure of a device for illustrating the construction of the operation method is described.

Figure 3A:
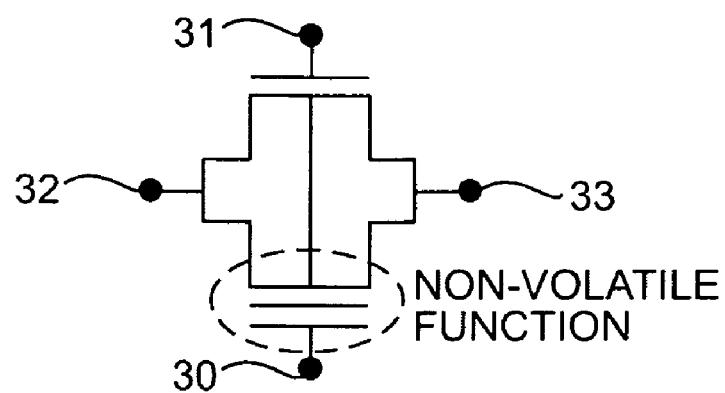
FIG. 3A is a diagram showing the device symbol of the 1T cell of the present invention. This device symbol indicates that a MOS device and a flash device are connected in parallel with a floating body intervening therebetween.
Figure 3B:
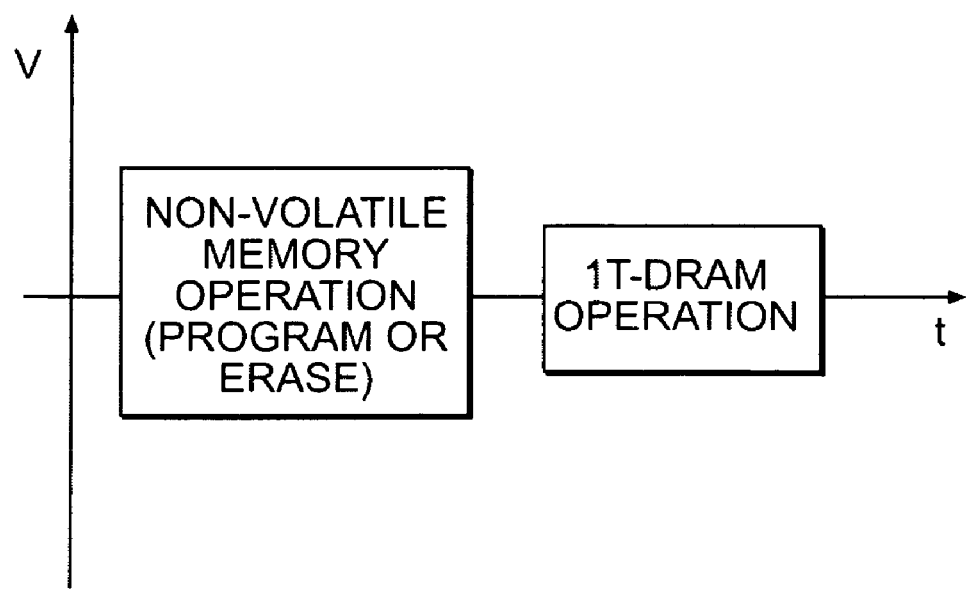
FIG. 3B is a diagram schematically showing the use of a non-volatile memory operation for the operation of the 1T-DRAM cell device of FIG. 3A.

FIG. 3A shows the device symbol of a 1T-DRAM cell with a non-volatile function in order to illustrate the method of operating a 1T-DRAM cell device according to the present invention. Regions 30 to 33 denote a control electrode terminal, a gate electrode terminal, a source terminal, and a drain terminal, respectively. A symbol indicative of a non-volatile function is included within a region indicated by dotted lines. FIG. 3B shows the basic method of operating a 1T-DRAM cell device having a dual gate structure according to the present invention. Referring to FIG. 5 showing cross sections in a channel length direction, the 1T-DRAM cell device having a dual gate structure according to the present invention includes a source 8, a drain 9, a gate electrode 11, and a control electrode 7. The source 8 and the drain 9 are formed on two respective opposite sides of the four sides of a floating body 3. The gate electrode 11 is formed on one of the remaining two opposite sides of the four sides of the floating body 3, and is insulated from the floating body 3 with a gate insulating layer 10 intervening therebetween. The control electrode 7 is formed on the other of the remaining two sides of the floating body 3, and is insulated by a gate stack (4, 5, and 6) capable of non-volatile charge storage. In order to improve the performance of the DRAM cell device according to the present invention and the uniformity of device characteristics, the 1T floating-body DRAM cell device uses the non-volatile function by controlling the voltage of the control electrode 7.

Figure 4:
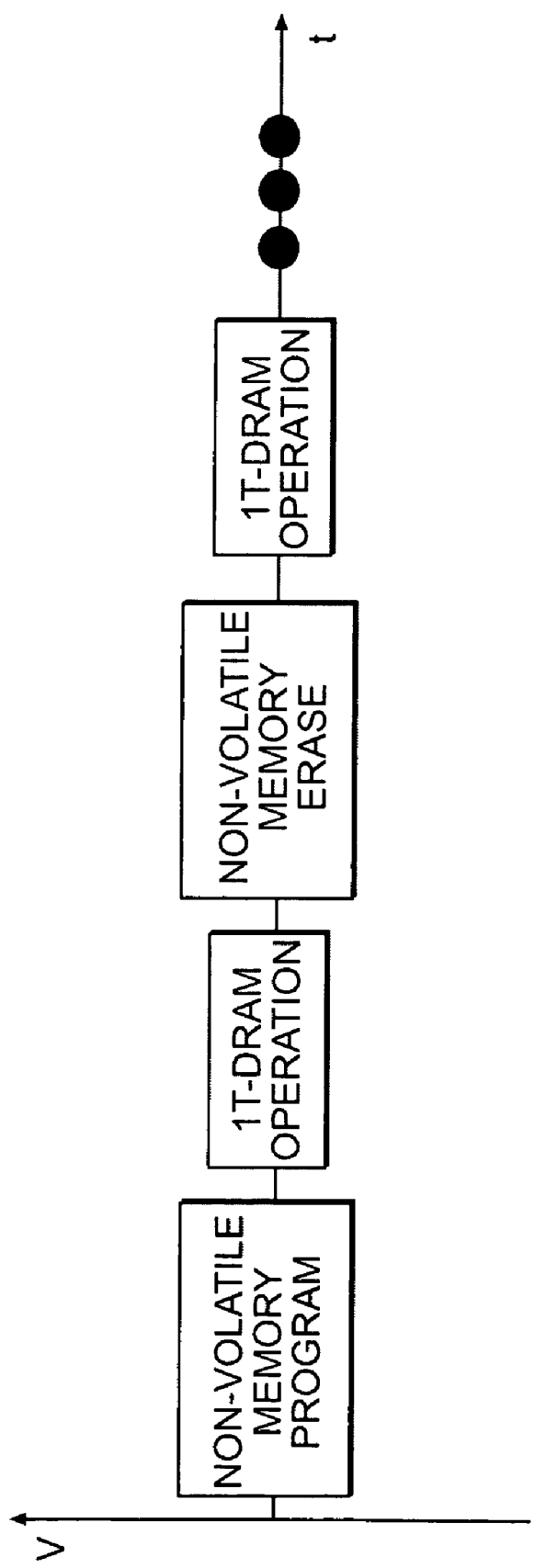
FIG. 4 is a diagram showing an application example of a method of operating the 1T cell of the present invention and schematically shows the application of a non-volatile memory-based program or erase operation during a 1T-DRAM cell operation.

FIG. 4 shows an example using the basic operation shown in FIG. 3A. Referring to FIG. 4, a non-volatile program operation and a non-volatile erase operation may be performed during the operation of the 1T-DRAM cell.

Figure 5A:
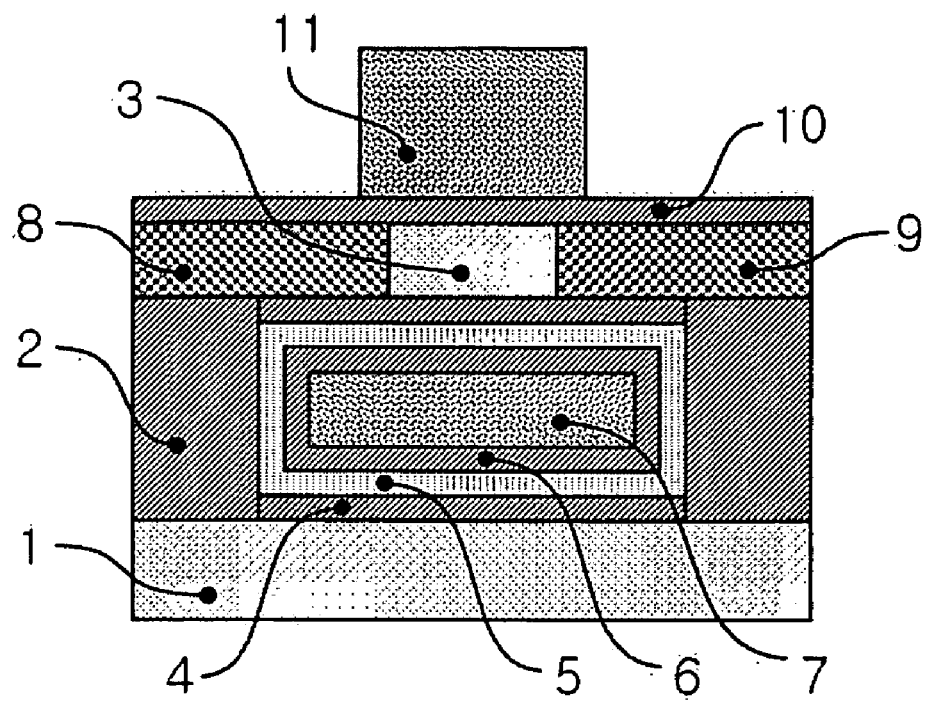
FIGS. 5A and 5B are diagrams showing examples of a structure in which a 1T-DRAM cell with a non-volatile function is implemented according to the present invention. The devices of FIGS. 5A and 5B have a dual gate structure having a flat channel.
Figure 5B:
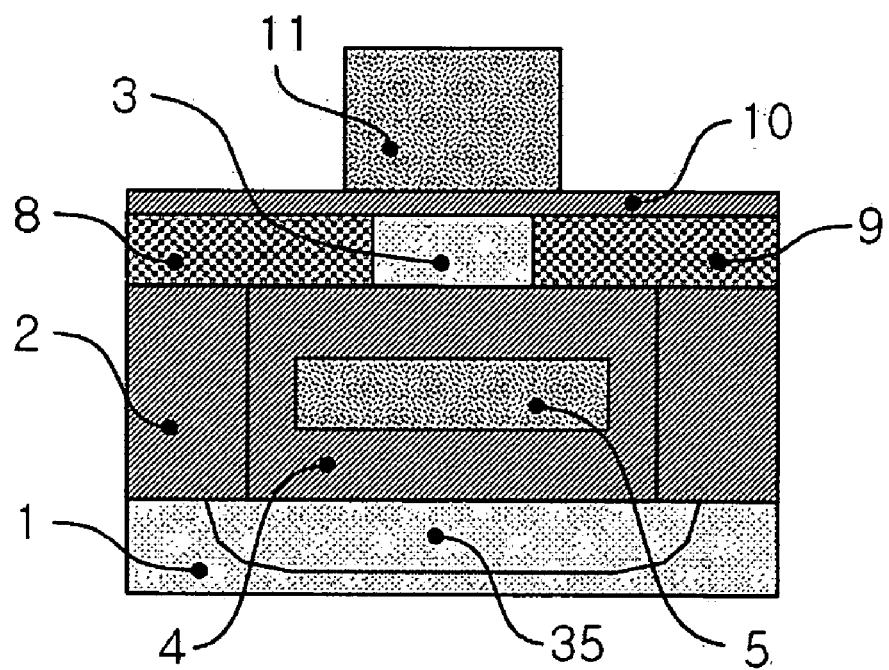

FIGS. 5A and 5B are longitudinal sections showing dual gate 1T-DRAM cells with a non-volatile function in a channel length direction in order to illustrate the operation method according to the present invention. In FIG. 5A, a first insulating layer 2 and a tunneling insulating layer 4 are formed on a silicon substrate 1. A charge storage node 5, a blocking insulating layer 6, and a control electrode 7 are formed above the silicon substrate 1. Here, the tunneling insulating layer 4, the charge storage node 5 and the blocking insulating layer 6 are defined as a gate stack. A source 8, a drain 9 and a floating body 3 are formed in a silicon film on the above structure, and a gate insulating layer 10 and a gate electrode 11 are formed thereon. Meanwhile, in FIG. 5B, a well 35 for a kind of an independent electrode is formed in a silicon substrate 1. A first insulating layer 2, a tunneling insulating layer 4, and a charge storage node 5 are formed above the silicon substrate 1. A source 8, a drain 9 and a floating body 3 are formed in a silicon film on the above-described structure, and a gate insulating layer 10 and a gate electrode 11 are formed thereon. In the device shown in FIG. 5B, the well 35 functions as the control electrode 7 shown in FIG. 5A. In the case where the well 35 is not formed, the substrate 1 may function as the control electrode 7 shown in FIG. 5A. In order to incorporate the above-described feature in the operating voltage conditions of FIGS. 10 to 13, a substrate voltage and a well voltage are indicated together in the lower parts of the drawings. The above-described structure represents only a core region, and additional insulating layers, contacts, and wiring lines may be formed on the structure.

Figure 6A:
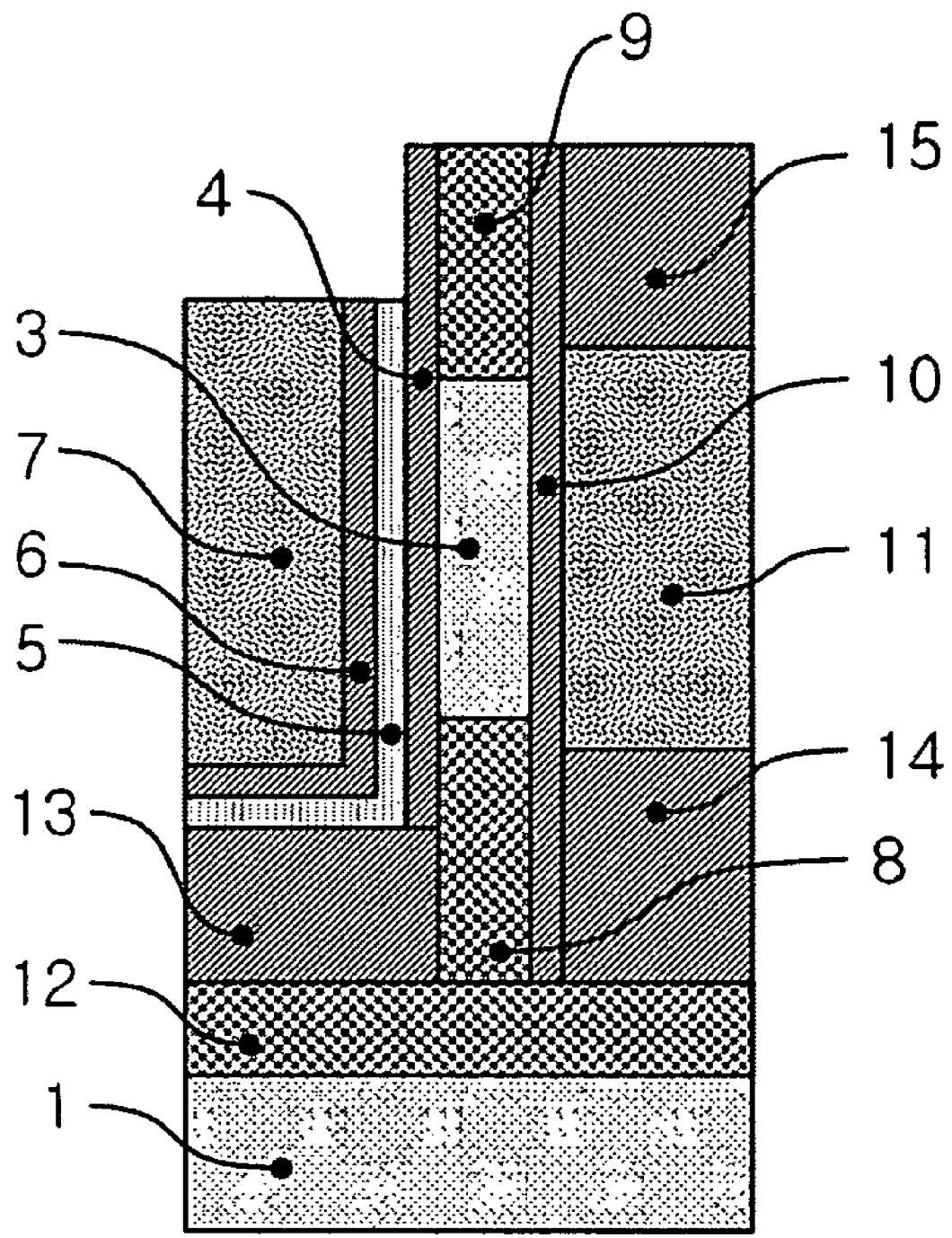
FIGS. 6A and 6B are diagrams showing some other examples of a structure in which a 1T-DRAM cell with a non-volatile function is implemented according to the present invention. The devices of FIGS. 6A and 6B have a dual gate structure having a vertical channel.
Figure 6B:
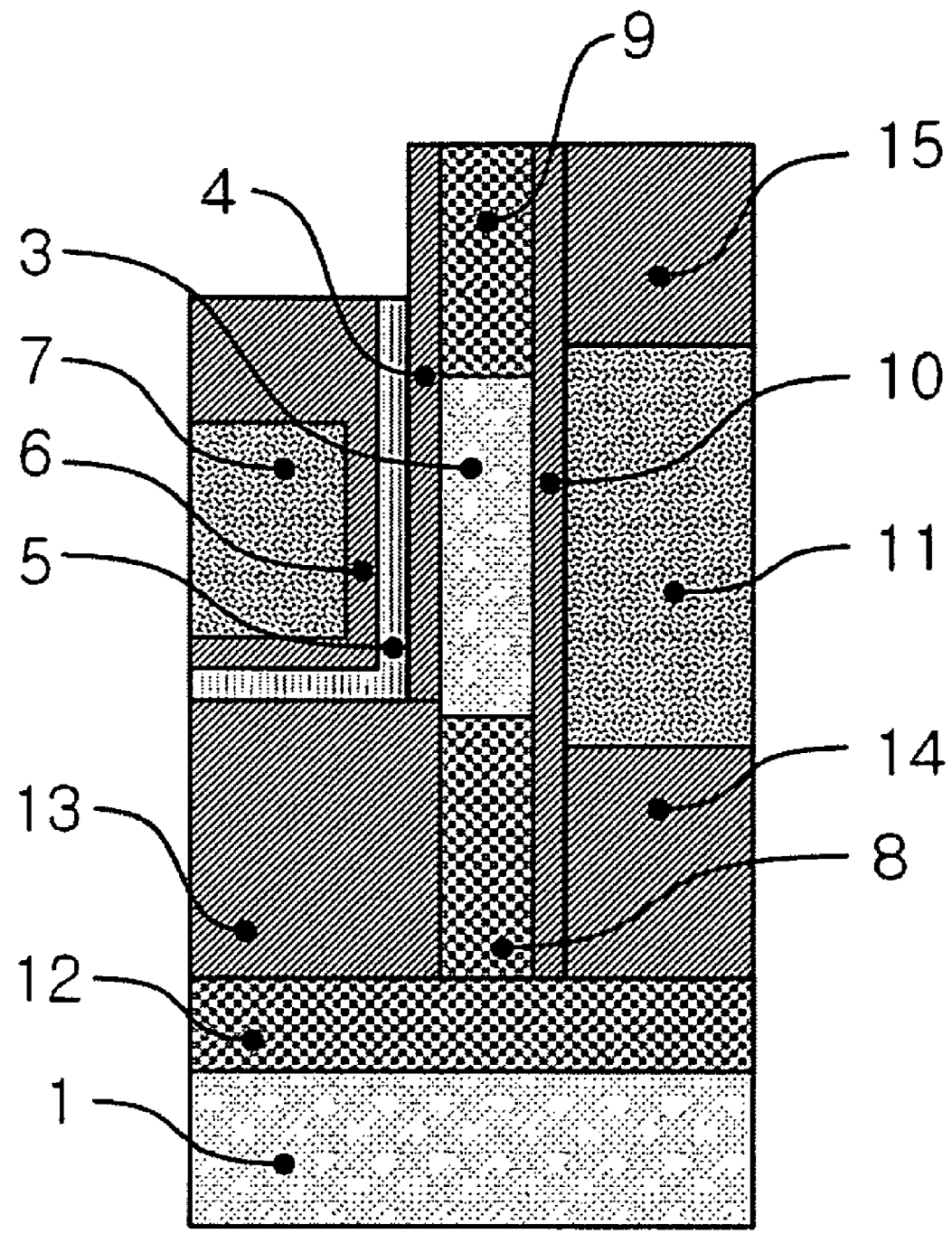

FIGS. 6A and 6B are longitudinal sections showing vertical 1T-DRAM cells using an operation method according to the present invention in a channel length direction. Referring to FIGS. 6A and 6B, each of the vertical 1T-DRAM cell devices according to the present invention includes a source wiring line 12, a second insulating layer 13, a third insulating layer 14, a source 8, a control electrode 7, a gate stack, a floating body 3, a gate insulating layer 10, a gate electrode 11, a fourth insulating layer 15 and a drain 9, all of which are stacked on a silicon substrate 1. This structure represents only a principal region, and additional insulating layers, contacts and wiring lines may be formed on the structure.

The vertical 1T-DRAM cell device is configured such that the source 8, the drain 9 and the floating body 3 are constructed in vertical form, and has a dual gate structure and a non-volatile function. FIGS. 6A and 6B show the 1T-DRAM cell devices having similar vertical structures. Referring to FIGS. 6A and 6B, a gate stack (a tunneling insulating layer 4, a charge storage node 5, and a blocking insulating layer 6) for providing a non-volatile function and the control electrode 7 are formed on the left side. Unlike the device of FIG. 6A, the device of FIG. 6B is configured such that the lengths of the gate stack and the control electrode 7 in a vertical direction are shorter than that of the floating body 3 in a vertical direction. The device of FIG. 6B having this structure is advantageous in that the GIDL is reduced by reducing the area in which the control electrode 7 or the charge storage node 5 overlaps the source 8 or the drain 9. Excessive GIDL may have a bad influence on the retention characteristic.

In the 1T-DRAM cell devices shown in FIGS. 5A, 5B, 6A and 6B, a non-volatile program operation for storing electric charges in the charge storage node 5 or a non-volatile erase operation of erasing electric charges stored in the charge storage node 5 may be performed by applying voltage to the floating body 3, the source 8 or the drain 9 or applying voltage to two or more of the floating body, the source, and the drain.

Figure 7A:
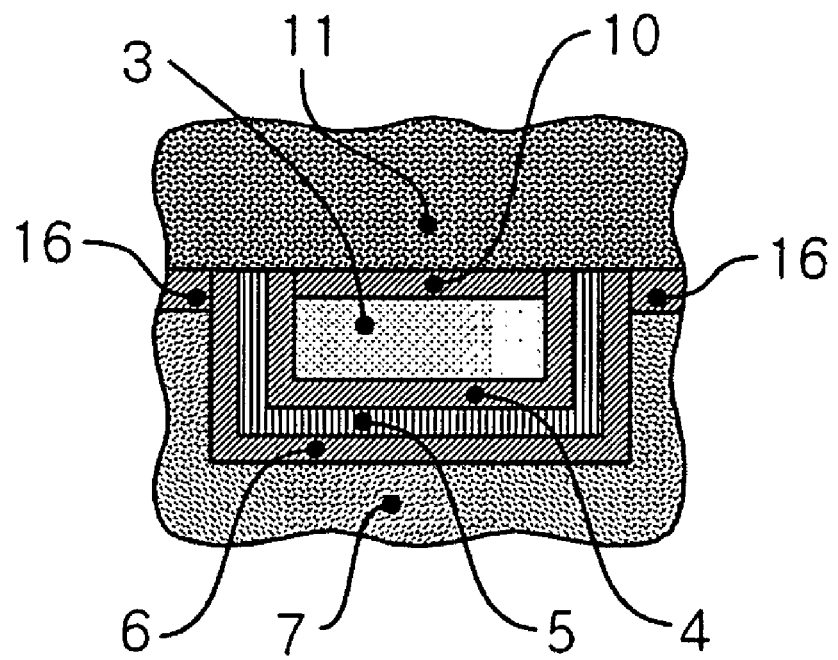
FIGS. 7A to 7C are partial sectional views in the channel width direction of the 1T-DRAM cell with a non-volatile function according to the present invention.
Figure 7B:
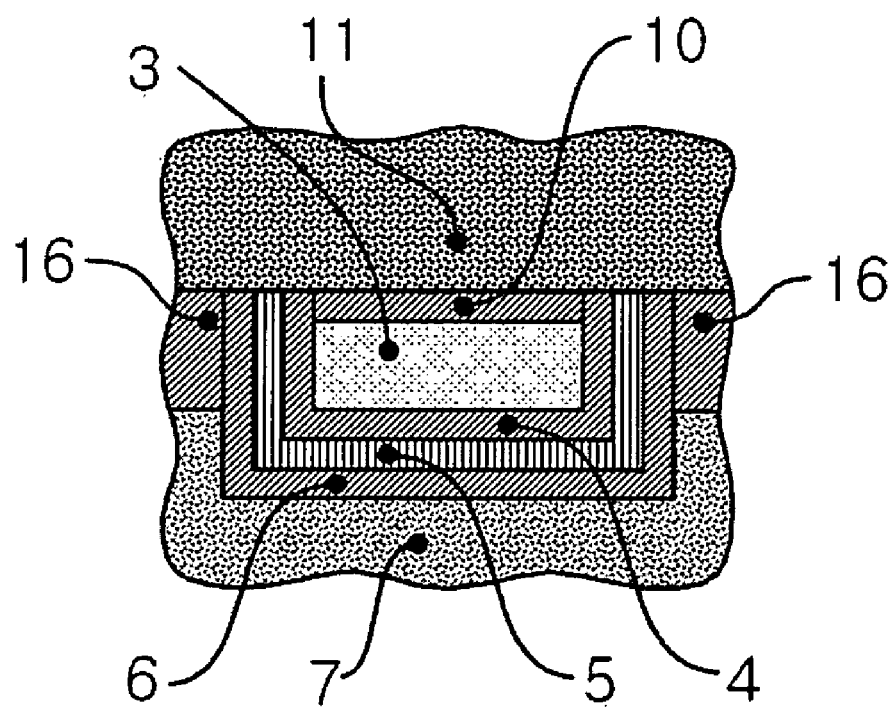
Figure 7C:
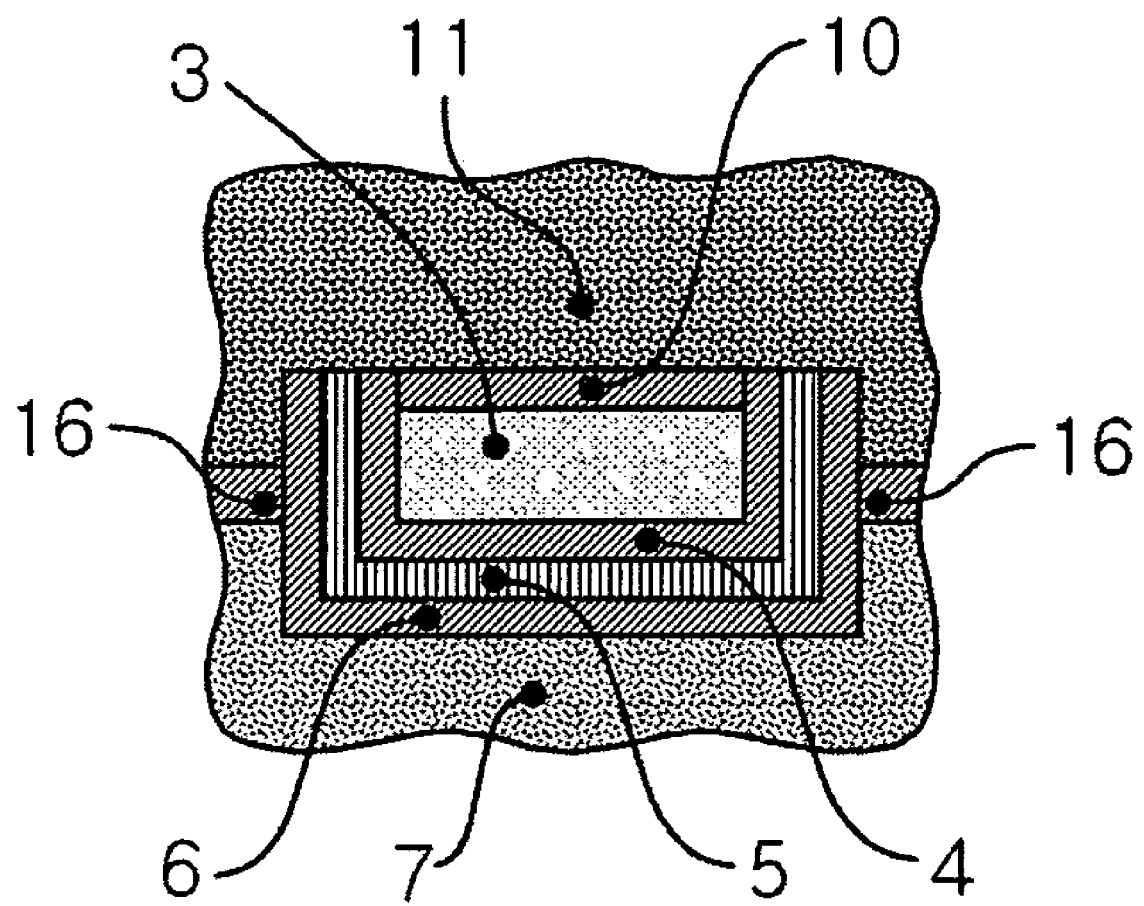

FIGS. 7A, 7B and 7C show the partial sections of the device structures of the present invention in a channel width direction. Although the sections are illustrated in horizontal form, the device structures are also applied to device structures in vertical form. The following description is given based on the sections in the channel width direction. The combination of a gate insulating layer 10 and a gate stack 4, 5, and 6 may be formed on four sides of a floating body 3. For example, the gate insulating layer 10 may be formed on one of the four sides of the floating body 3, and the gate stack may be formed on the remaining three sides of the floating body 3. A gate electrode 11 may be formed on the gate insulating layer 10, and a control electrode 7 may be formed on the gate stack. An inter-electrode insulating layer 16 is formed between the gate electrode 11 and the control electrode 7 in a region outside the floating body 3, thereby electrically insulating the gate electrode 11 and the control electrode 7. As shown in FIGS. 7A, 7B and 7C, the gate electrode 11, the control electrode 7, and the combination of the inter-electrode insulating layer 16 may be formed on the gate insulating layer 10 and the gate stack, which are formed on the four sides of the floating body 3.

Figure 8A:
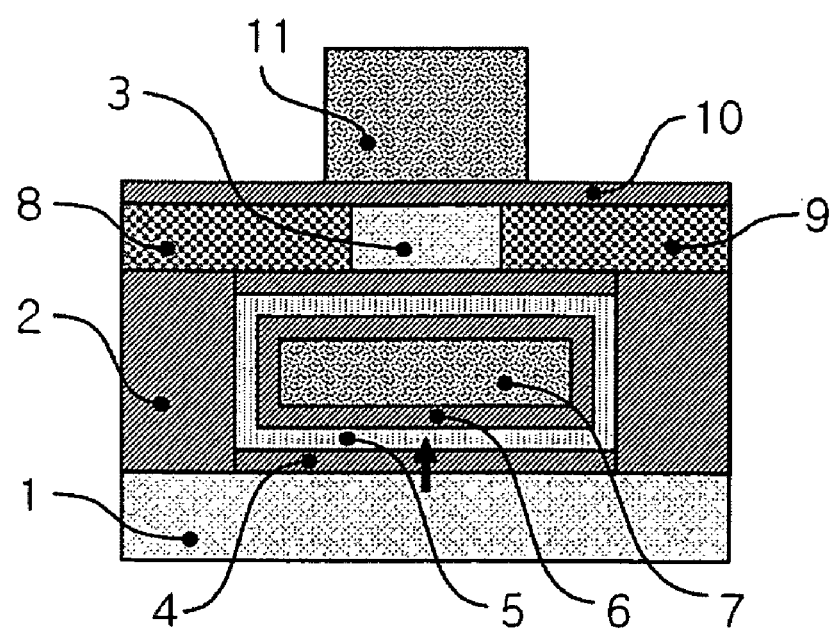
FIG. 8A is a sectional view showing an example in which electric charges are programmed into or erased from a substrate in the 1T-DRAM cell with the non-volatile function according to the present invention.
Figure 8B:
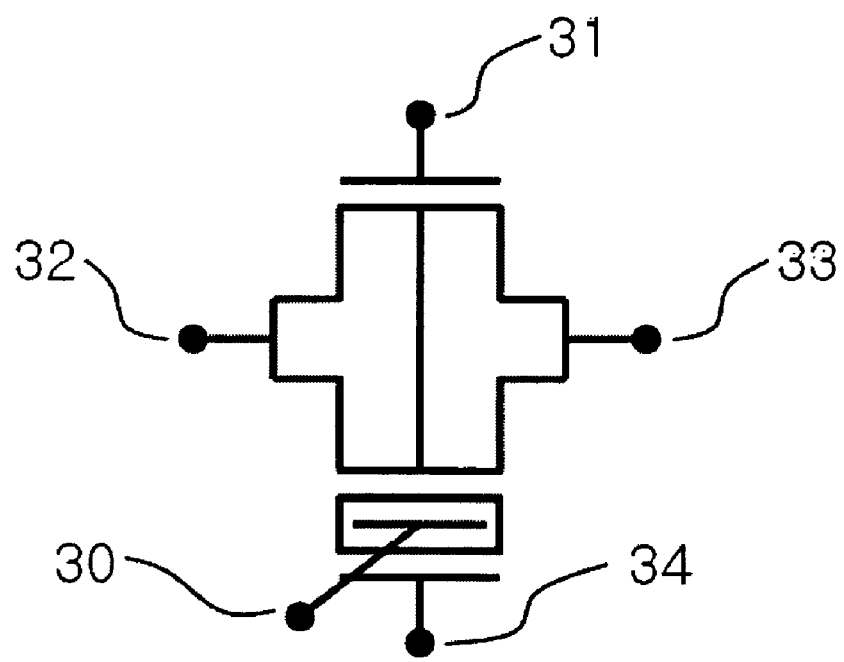
FIG. 8B is a diagram showing the device symbol of the 1T-DRAM cell.
Figure 9A:
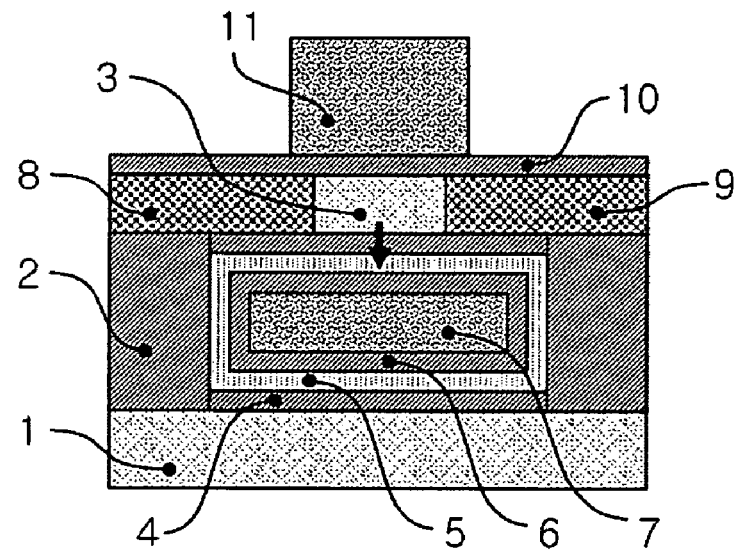
FIGS. 9A and 9B are diagrams showing examples in which electric charges are stored from a floating body to a storage node in the device structures of FIGS. 5A to 6B according to the present invention.
Figure 9B:
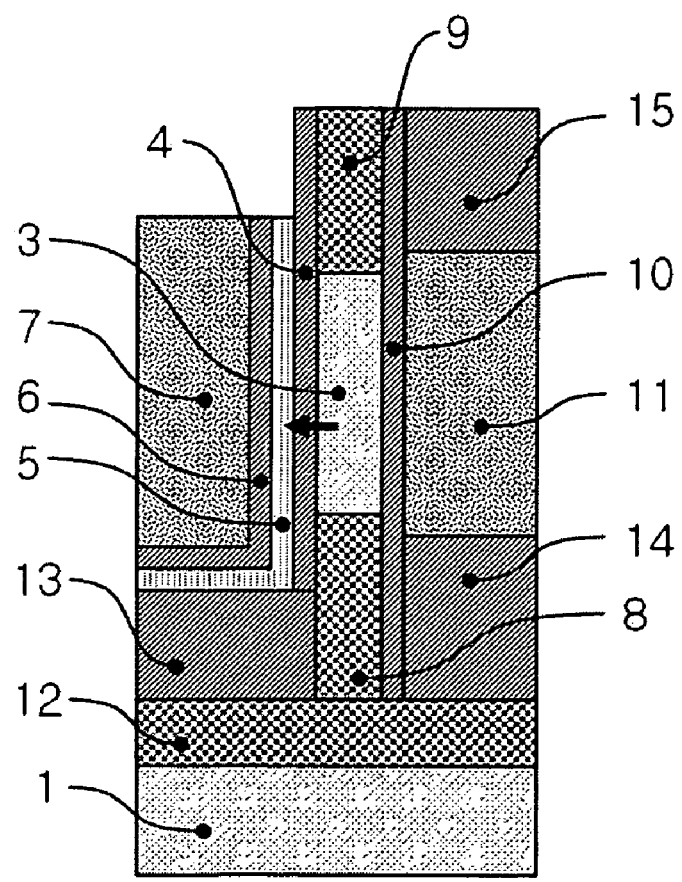

FIGS. 8A and 8B are a longitudinal section of a 1T-DRAM cell device in a channel length direction according to an embodiment of the present invention and the device symbol of the 1T-DRAM cell device. Referring to FIGS. 8A and 8B, the 1T-DRAM cell device according to the present embodiment is constructed to store or erase electric charges using a substrate 1.

FIG. 8A is a longitudinal section illustrating the operation method of the present embodiment. The structure of FIG. 8A is identical to that of FIG. 5A except that an arrow is added in order to describe that electric charges can be stored from the silicon substrate 1 to a charge storage node 5. FIG. 8B shows the device symbol in which the structure of FIG. 8A is incorporated. In FIG. 8B, reference numeral 30 denotes the terminal of the control electrode 7, 31 denotes the terminal of a gate electrode 11, 32 and 33 denote the terminals of a source 8 and a drain 9, respectively, and 34 denotes a substrate electrode terminal connected to the substrate 1. The substrate electrode terminal 34 may be implemented by forming the well 35, as shown in FIG. 5B. Referring to FIG. 8A, the electric charges in the substrate 1 move to the charge storage node 5 in the direction of an arrow indicated in the substrate, and are then stored in the substrate.

A more detailed operation method is described using the above-described various structures and schematic operation methods.

In the 1T floating-body DRAM cell device having a dual gate structure according to the present embodiment, the source 8 and the drain 9 are respectively formed on two opposite sides of the four sides of the floating body 3 on the basis of the section in a channel length direction. The gate electrode 11 insulated by the gate insulating layer 10 is formed on one of the remaining two opposite sides of the four sides of the floating body 3, and the gate stack capable of non-volatile charge storage and the control electrode 7 are formed on the other of the remaining two opposite sides of the floating body 3. The 1T-DRAM cell device having the above structure according to the present invention operates a 1T floating-body DRAM cell device using a non-volatile erase operation and a non-volatile program operation in order to improve device performance and the uniformity of device characteristics.

The dual gate 1T floating-body DRAM cell according to the present invention is configured such that the gate stack is formed to surround the control electrode 7 partially or completely and is formed on the semiconductor substrate 1, thereby controlling the voltage of the substrate 1 during a non-volatile program operation, during a non-volatile erase operation or when the dual gate 1T floating-body DRAM cell operates as a 1T-DRAM cell device. Here, the "operating as the 1T-DRAM cell device" includes all of 'write0' (or 'W0') and 'write1' (or 'W1') operations for storing information in the floating body and a read operation for reading information stored in the floating body.

The 1T floating-body DRAM cell having the above operation method according to the present invention may perform a non-volatile program operation for storing electric charges in the charge storage node of the gate stack and a non-volatile erase operation of erasing electric charges stored in the charge storage node of the gate stack by controlling the voltage of the control electrode 7 before, after or while operating as the DRAM cell device.

The 1T floating-body DRAM cell having the above operation method according to the present invention may use a Fowler-Nordheim (FN) method, a hot electron injection method, a hot hole injection method or a combination of them in order to perform the non-volatile program operation and the non-volatile erase operation.

The 1T floating-body DRAM cell having the above operation method according to the present invention may operate to store information corresponding to "write1" or "write0", which is volatile DRAM cell information stored in the floating body through the DRAM cell operation, as non-volatile information in response to the non-volatile program or non-volatile erase operation.

The 1T floating-body DRAM cell having the above operation method according to the present invention may operate to apply a negative (−) voltage, 0 V or a positive (+) voltage to the control electrode 7 in uniform or pulse form while operating as the DRAM cell device after a program or erase operation based on a non-volatile function has been performed using the control electrode 7.

If the voltage of the control electrode 7 is controlled during the DRAM operation after the non-volatile charge storage node 5 has been programmed as described above, the difference between a current value flowing when information stored in the floating body during a "read" operation is "write1" and a current value flowing when information stored in the floating body during the "read" operation is "write0" is increased. Accordingly, the retention characteristic as well as the margin can be improved.

In the above method, the application of voltage to the control electrode 7 includes applying the voltage to the control electrode 7 of each cell device, applying the voltage to a control electrode connected to cell devices arranged in rows or columns, or applying the voltage to a control electrode connected to cell devices arranged in rows and columns.

In the above method, in the performance of a program or erase operation based on a non-volatile function using the control electrode, the polarity, magnitude or duration of voltage applied to the control electrode 7 may be controlled. As described above, if a high positive voltage is applied to the control electrode 7 in pulse form in order to perform a non-volatile program operation, electrons enter the charge storage node 5 according to the FN method. In contrast, if a negative voltage is applied to the control electrode, electrons exit from the charge storage node 5. In this case, the duration of a pulse determines the quantity of electrons. Furthermore, when the magnitude of pulse voltage is high, a great change in the quantity of electric charges is caused within a short time.

The 1T-DRAM cell device having the above structure may perform a non-volatile program operation or a non-volatile erase operation through the substrate 1 or the well 35 by controlling the voltage of the control electrode 7 and the substrate 1 or controlling the voltage of the control electrode 7 and the well 35 formed in the substrate 1.

The 1T-DRAM cell device having the above structure may perform a non-volatile program operation or a non-volatile erase operation on the charge storage node 5 by controlling voltage applied to the control electrode 7 and the source 8 or drain 9.

In the case where the charge storage node 5 of the gate stack of the DRAM cell device having the above structure is formed of a thin insulating film or nano-size dots, non-volatile information may be locally stored in the charge storage node 5 by performing a non-volatile program operation or a non-volatile erase operation through a hot carrier method using the control electrode 7.

In another embodiment of the DRAM cell device having the above structure, the control electrode 7 may exist in a floating state. If the control electrode exists in a floating state as described above, a non-volatile program operation or a non-volatile erase operation may be performed on the floated control electrode by controlling the voltage of the substrate 1 or the voltage of the well 35 formed in the substrate 1.

In the 1T-DRAM cell device having the above structure, in the case where voltage is applied to the substrate 1 during a non-volatile memory operation or a 1T-DRAM cell device operation, an electrode (referred to as a 'well electrode') is formed in the substrate in well form and is electrically isolated from the substrate 1, and voltage may be applied to a well electrode connected to cell devices arranged in rows or columns or voltage may be applied to a well electrode connected to cell devices arranged in rows and columns. Here, the voltage applied to the substrate 1 or the well electrode may have a constant value or a pulse form.

A "write1" operation for storing information corresponding to "write1" in the floating body of the 1T-DRAM cell device may be performed by applying voltage, including 0 V, to the gate electrode 11, the control electrode 7, the source 8, the drain 9 and the substrate 1, in which case voltage preset to a value corresponding to "write1" may be applied to the gate electrode 11 and the drain 9, voltage preset to a value corresponding to "write1" may be applied to the control electrode 7 and the drain 9, and voltage preset to a value corresponding to "write1" may be applied to the gate electrode 11, the control electrode 7, and the drain 9. In this case, a method of creating hot carriers or the GIDL may be used to perform the "write1" operation.

A "write0" operation for storing information corresponding to "write0" in the floating body of the 1T-DRAM cell device may be performed by applying voltage, including 0 V, to the gate electrode 11, the control electrode 7, the source 8, the drain 9, and the substrate 1, in which case voltage preset to a value corresponding to "write0" may be applied to the gate electrode 11 and the drain 9, voltage preset to a value corresponding to "write0" may be applied to the control electrode 7 and the drain 9, and voltage preset to a value corresponding to "write0" may be applied to the gate electrode 11, the control electrode 7, and the drain 9.

The performance of the "write0" operation on the 1T-DRAM cell device includes applying voltage preset to a value corresponding to the "write0" operation to the control electrode 7 connected to cell devices, which are arranged in parallel to a word line to which the gate electrodes 11 of the cell devices are tied, or applying voltage preset to a value corresponding to the "write0" operation to the control electrode 7 connected to cell devices, which are arranged in parallel to a bit line to which the drain 9 of the cell devices are tied.

The above method includes performing the "write0" operation by applying a negative (−) voltage to an unselected word line in order to perform the "write0" operation on the 1T-DRAM cell device.

The read operation for reading information stored in the floating body of the 1T-DRAM cell device may be performed by applying voltage, including 0 V, to the gate electrode 11, the control electrode 7, the source 8, the drain 9, and the substrate 1, in which case voltage preset to a value corresponding to "read" may be applied to the gate electrode 11 and the drain 9, voltage preset to a value corresponding to "read" may be applied to the control electrode 7 and the drain 9, and voltage preset to a value corresponding to "read" may be applied to the gate electrode 11, the control electrode 7, and the drain 9.

Meanwhile, a 1T-DRAM cell device according to another embodiment of the present invention may perform the "write0" operation and the "write1" operation by controlling the source voltage of a cell device.

Meanwhile, a 1T-DRAM cell device according to still another embodiment of the present invention is configured such that the gate electrode 11 does not overlap the source 8 and the drain 9. In this case, the "write1" operation is performed on the 1T-DRAM cell device by controlling gate and drain voltages so that impact ionization occurs chiefly in the region between the outside of the channel of a device and the drain.

Meanwhile, the 1T-DRAM cell device according to the present invention may perform a non-volatile program operation and a non-volatile erase operation by selectively injecting electric charges into the charge storage node on the source or drain side using hot electrons or hot holes or injecting electric charges into the charge storage node 5 on the source and drain sides at the same time. For example, the case where electric charges are injected into the drain-side charge storage node 5 is described below. When a positive voltage is applied to the drain 9 and the control electrode 7 and 0 V is applied to the source 8, impact ionization occurs near a junction between the drain 9 and the floating body 3. Electrons that have obtained energy through the impact ionization enter the charge storage node 5 near the junction, so that a program operation is performed.

Preferred embodiments of the present invention are described in detail below with reference to the accompanying drawings. The following embodiments are prepared to inform persons skilled in the art of the principal spirit of the present invention. Accordingly, the present invention is not limited to these embodiments, and may be implemented in various forms.

Operation Method for 1T-DRAM Cell

A variety of embodiments related to a method of operating the 1T-DRAM cell according to the present invention are described with reference to FIGS. 10 to 14. $V_{cg}$, $V_g$, $V_d$, and $V_{sub}$ shown in FIGS. 10 to 14 denote control electrode voltage, gate electrode voltage, drain voltage, and substrate voltage, respectively. The voltages are preferably applied in pulse form, but may be applied in DC form or in various function forms. $V_{well}$ denotes well voltage which may be applied to the well 35 in the case where the well 35 is formed in the substrate 1.

A program operation based on the non-volatile function in the 1T-DRAM cell device according to the present invention refers to the storage of electric charges (electrons in the case of a n type cell device, and holes in the case of a p type cell device) in the charge storage node 5, and an erase operation based on the non-volatile function in the 1T-DRAM cell device of the present invention refers to the erasing of electric charges from the charge storage node 5. A method of performing the program or erase operation uses an FN method or a hot carrier injection method. The thick dotted lines in FIGS. 10 to 14 indicate 0 V. The simultaneous indication of a thick dotted line, a dashed line and a solid line means that one of three bias conditions corresponding to the three lines is applied. In this specification, the description is given on the assumption that a device is a NMOS type memory device, unless otherwise described. The entire description or the basic principle given in this specification may be applied to PMOS type memory devices as they are.

FIG. 10 illustrates a variety of voltage conditions for providing a program operation based on the non-volatile function in the 1T-DRAM cell device according to the present invention. Although various voltage conditions other than the voltage conditions shown in FIG. 10 are possible, only about ten types of the voltage conditions shown in FIG. 10 are described here.

A first condition is applicable to the case where electrons are stored in the charge storage node 5 using an FN method. In this condition, FN tunneling is generated in the charge storage node 5 by applying a positive voltage only to the control electrode 7 and 0 V to the remaining electrodes, so that electrons are stored in the charge storage node 5. In a second condition, a high positive voltage is applied to the control electrode 7, a positive (solid line) or negative (dashed line) voltage is applied to the drain 9, and 0 V is applied to electrodes other than the control electrode 7. In the case where there exists a region where the drain 9 overlaps the control electrode 7, if a positive voltage is applied to the drain 9, the migration of electrons through the overlapping region is very low. In contrast, if a negative voltage is applied to the drain 9, the migration of electrons through the overlapping region increases significantly. A third condition is the same as the second condition except that 0 V is applied to the drain 9 and a positive or negative voltage is applied to the source 8. In the case where there exists a region where the source 8 overlaps the control electrode 7, if a positive voltage is applied to the source 8, the migration of electrons through the overlapping region is very low. In contrast, if a negative voltage is applied to the source 8, the migration of electrons through the overlapping region increases significantly. A fourth condition is the same as the third condition in that a high positive voltage is applied to the control electrode 7 and a positive or negative voltage is applied to the source 8, but is different from the third condition in that a positive or negative voltage is further applied to the drain 9. Here, in the case where there exists a region where the control electrode 7 overlaps the source 8 and the drain 9, if a positive voltage is applied to the source 8 and the drain 9, the migration of electrons through the overlapping region is very small. However, if a negative voltage is applied to the source 8 and the drain 9, the migration of electrons through the overlapping region increases significantly. In a fifth condition, voltage for FN tunneling is applied to the control electrode 7, a positive or negative voltage is applied to the substrate 1 or the well 35, and 0 V is applied to the remaining electrodes. If the voltage $V_{sub}$ or $V_{well}$ is positive, the migration of electrons from the substrate 1 or the well 35 to the charge storage node 5 will be very low. In contrast, if the voltage $V_{sub}$ or $V_{well}$ is negative, the migration of electrons from the substrate 1 or the well 35 to the charge storage node 5 will be very high. In a sixth condition, the voltage $V_{sub}$ or $V_{well}$ is negative and is applied to the substrate 1 or the well 35 so that FN tunneling is generated, and 0 V is applied to the remaining electrodes. A seventh condition is the same as the sixth condition except that a positive voltage is further applied to the control electrode 7. In the case where the charge storage node 5 is formed between the control electrode 7 and the substrate 1, a program operation using FN tunneling becomes fast. Eighth and ninth conditions are voltage conditions when a program operation using hot carriers is performed. In these conditions, a positive voltage is applied to the control electrode 7, a positive voltage is applied to the source 8 or the drain 9, and 0 V is applied to the remaining electrodes. A tenth condition is a voltage condition applicable to the 1T-DRAM cell structure shown in FIG. 5B. In this condition, there is no region defined as the control electrode 7 and the substrate 1 or the well 35 functions as a control electrode. Accordingly, the voltage $V_{cg}$ is indicated by "X". In this condition, electrons are stored in the charge storage node 5 by applying a positive voltage capable of generating FN tunneling to the substrate 1 or the well 35. Furthermore, the voltage $V_g$ is 0 V, and 0 V, a positive voltage or a negative voltage may be applied to both the source 8 and the drain 9.

FIG. 11 illustrates a variety of voltage conditions for providing an erase operation based on the non-volatile function in the 1T-DRAM cell device according to the present invention. Although various voltage conditions other than the voltage conditions shown in FIG. 11 are possible, only about ten types of the voltage conditions shown in FIG. 10 are described here.

A first condition includes applying a negative voltage capable of generating FN tunneling to the control electrode 7 and 0 V to the remaining terminals. Electrons stored in the charge storage node 5 are erased from the charge storage node 5 by a high negative voltage applied to the control electrode. In a second condition, a negative voltage for generating FN tunneling is applied to the control electrode 7, a positive or negative voltage is applied to the drain 9, and 0 V is applied to the remaining electrodes. In the case where there is a region where the control electrode 7 overlaps the drain 9, if a positive voltage is applied to the drain 9, electrons exit to the drain region more rapidly. However, if a negative voltage is applied to the drain 9, electrons exit to the remaining regions other than the drain 9 more rapidly. In a third condition, a negative voltage for generating FN tunneling is applied to the control electrode 7, a positive or negative voltage is applied to the source 8, and 0 V is applied to the remaining electrodes. Here, in the case where there is a region where the control electrode 7 overlaps the source 9, if a positive voltage is applied to the source 9, electrons exit to the source region more rapidly. In contrast, if a negative voltage is applied to the source 8, electrons exit to the remaining regions other than the source 8 more rapidly. In a fourth condition, a negative voltage for generating FN tunneling is applied to the control electrode 7, a positive or negative voltage is applied to the source 8 and the drain 9, and 0 V is applied to the remaining terminals. In the case where there is a region where the control electrode 7 overlaps the source 8 and the drain 9, if a positive voltage is applied to the source 8 and the drain 9, electrons exit to the source and drain regions more rapidly than to the floating body 3. However, if a negative voltage is applied to the source 8 and the drain 9, electrons exit to the remaining regions other than the source 8 and the drain 9 more rapidly. In a fifth condition, a negative voltage for generating FN tunneling is applied to the control electrode 7, a positive or negative voltage is applied to the substrate 1 or the well 35, and 0 V is applied to the remaining electrodes. If a positive voltage is applied to the substrate 1 or the well 35, electrons mainly exit to the substrate 1, and if a negative voltage is applied to the substrate 1 or the well 35, electrons mainly exit to the remaining regions other than the substrate 1. In a sixth condition, a positive voltage capable of generating FN tunneling is applied to the substrate region or the well region and 0 V is applied to the remaining regions. In this case, electrons stored in the charge storage node 5 exit to the substrate region or the well region. A seventh condition is the same as the sixth condition except that a negative voltage is further applied to the control electrode 7. In this case, since an electric field between the control electrode 7 and the substrate 1 or the well 35 is great, electrons may exit to the substrate 1 more rapidly than those in the sixth condition. Eighth and ninth conditions are voltage conditions for an erase operation using hot carriers. First, in the eighth condition, if a negative voltage is applied to the control electrode 7 and a positive voltage is applied to the drain 7, hot holes are generated in the floating body 3 near the drain 9 and are then injected into the charge storage node 5, so that the erase operation is performed. In this operation, 0 V is applied to the remaining regions. In the ninth condition, hot holes are generated in the floating body 3 near the source 8 and then injected into the charge storage node 5, so that the erase operation is performed. In a tenth condition, a negative voltage for generating FN tunneling is applied to the substrate region or the well region. The tenth condition may be applied to a 1T-DRAM cell device having the structure of FIG. 5B, that is, a device in which the control electrode 7 does not exist and the substrate 1 or the well 35 functions as a control electrode. Accordingly, the voltage $V_{cg}$ is indicated by "X". In this case, electrons are erased from the charge storage node 5 by applying a negative voltage for enabling the generation of FN tunneling to the substrate 1 or the well 35. In this operation, the voltage $V_g$ is 0 V, and 0 V, a positive voltage or a negative voltage may be applied to both the source 8 and the drain 9.

FIG. 12 is a diagram showing various embodiments of voltage conditions for performing the "write1" operation of the DRAM cell device operation in the 1T-DRAM cell device according to the present invention. The description is given on the assumption that the device is an n type memory device as described above, and the same principle is applied to p type memory devices. Here, "write1" is an operation for lowering the threshold voltage of a device by storing redundant holes in the floating body 3.

In a first condition, the voltages $V_g$ and $V_d$ are positive, and the voltage of the remaining regions is 0 V. That is, the device is turned on, and impact ionization is generated in the device. Consequently, electrons exit from the drain 9 and holes are stored in the floating body 3. A second condition is the same as the first condition except that a negative voltage is applied to the control electrode 7 so that more redundant holes can be stored in the floating body 3. In a third condition, the voltages $V_g$ and $V_s$ are positive, and 0 V is applied to the remaining regions. Consequently, impact ionization is generated in the device and redundant holes are stored in the floating body 3. In a fourth condition, the voltages $V_g$ and $V_s$ are positive. As in the second condition, a negative voltage is applied to the control electrode 7 so that more holes can be stored in the floating body 3. In fifth and sixth conditions, redundant holes are stored in the floating body 3 using GIDL. First, in the fifth condition, a negative voltage $V_g$ and a positive voltage $V_d$ are applied, and the remaining voltages are 0 V, thereby generating the GIDL. In the sixth condition, a negative voltage $V_g$ and a positive voltage $V_s$ are applied and the remaining voltages have 0 V, thereby generating the GIDL. In a seventh condition, negative voltage $V_g$ and $V_{cg}$ are applied and a positive voltage $V_d$ is applied, thereby generating the GIDL. The remaining voltages remain 0 V. In an eighth condition, negative voltage $V_g$ and $V_{cg}$ are applied and a positive voltage $V_s$ is applied, thereby generating the GIDL. The remaining voltages remain 0 V. Alternatively, in the seventh and eighth conditions, the "write1" operation may be performed by setting the voltage $V_g$ to 0 V and generating GIDL using the voltages $V_g$ and $V_d$ or $V_s$. Ninth and tenth conditions are voltage conditions, which are applied to a structure without the control electrode 7 as shown in FIG. 5B. Since a control electrode does not exist, the voltage $V_{cg}$ is indicated by "X". In the ninth condition, positive voltage $V_g$ and $V_d$ are applied in order to generate impact ionization, and a negative voltage $V_{sub}$ or $V_{well}$ is applied in order to store more redundant holes in the floating body 3. Here, the remaining voltages remain 0 V. Although not shown in the drawing, positive voltage $V_g$ and $V_s$ may be applied so as to generate impact ionization and a negative voltage $V_{sub}$ or $V_{well}$ may be applied so as to store more redundant holes in the floating body 3. In the tenth condition, the "write1" operation is performed by generating GIDL. In order to perform the "write1" operation, a positive voltage $V_d$ and a negative voltage $V_{sub}$ (or $V_{well}$) are applied, and $V_g$ is 0 V or a negative voltage. Alternatively, in the tenth condition, the "write1" operation may be performed by setting the voltage $V_d$ to 0 V and applying a positive voltage $V_s$.

FIG. 13 is a diagram showing various embodiments of voltage conditions for performing the "read" operation of the DRAM cell device operation in the 1T-DRAM cell device according to the present invention. Although the following description is given on the assumption that the device is an n type memory device as described above, the same principle is applied to p type memory devices.

In a first condition, the voltages $V_g$ and $V_d$ are positive, and 0 V is applied to the remaining regions. That is, the device is turned on so that the amount of current can be sensed in a peripheral circuit. In a second condition, a negative voltage $V_{cg}$ may be applied in order to reduce the disturbance of cells that are not selected in a "read" operation, in which information of "write1" is stored, in the "read" operation of the first condition. The negative voltage $V_{cg}$ helps holes, which are stored in the floating body 3, to be retained in the "read" operation. In a third condition, the voltages $V_g$ and $V_s$ are positive, and 0 V is applied to the remaining regions. That is, the device is turned on so that the amount of current can be sensed in a peripheral circuit. A fourth condition has the following characteristics. In order to reduce the disturbance of cells in which the information of "write1" is stored in the "read" operation of the second condition, a negative voltage $V_{cg}$ may be applied. The negative voltage $V_{cg}$ helps holes, which are stored in the floating body 3, to be retained in the floating body 3 in the "read" operation. Fifth to eighth conditions are voltage conditions applicable to the structure of the 1T-DRAM cell of FIG. 5B. That is, since the control electrode 7 does not exit, the substrate 1 or the well 35 functions as a control electrode. The voltage $V_{cg}$ is indicated by "X" because there is no control electrode. In the fifth condition, a "read" operation is performed by applying a positive voltage $V_g$ and a positive voltage $V_d$ and applying 0 V to the remaining regions. The sixth condition is the same as the fifth condition except that a negative voltage $V_{sub}$ or $V_{well}$ is further applied so that more holes can be stored in the floating body 3. In the seventh condition, a "read" operation is performed by applying a positive voltage $V_g$ and a positive voltage $V_s$ and applying 0 V to the remaining regions. The eighth condition is the same as the sixth condition except that a negative voltage $V_{sub}$ or $V_{well}$ is further applied so that more holes can be stored in the floating body 3.

Figure 14:
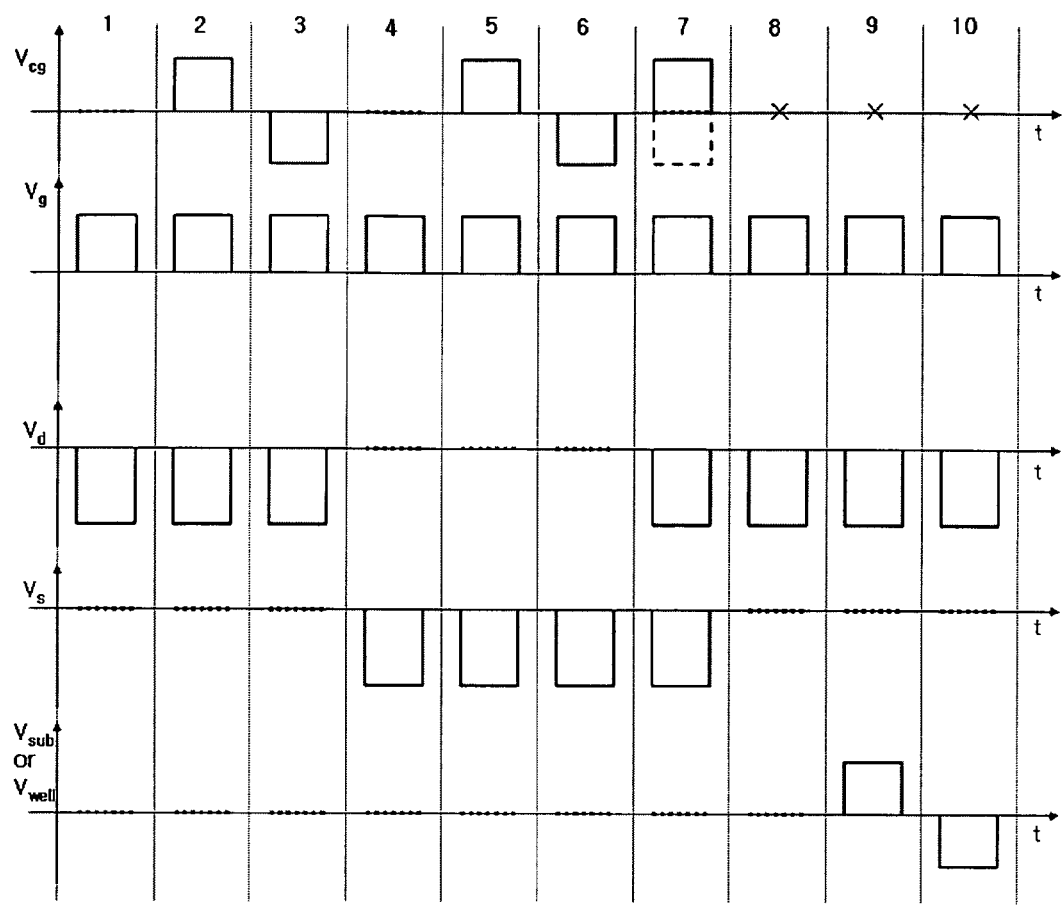

FIG. 14 is a diagram showing various embodiments of voltage conditions for performing the "write0" operation of the DRAM cell device operation in the 1T-DRAM cell device according to the present invention. Although the following description is given on the assumption that the device is an n type memory device as described above, the same principle is applied to p type memory devices.

In a first condition, the holes in the floating body 3 are erased by applying a positive voltage $V_g$ and a negative voltage $V_d$, resulting in hole depletion, and 0 V is applied to the remaining electrodes. In a second condition, a positive voltage $V_{cg}$ is applied under the first condition, thereby helping the hole depletion of the floating body 3. In a third condition, a negative voltage $V_{cg}$ is further applied under the first condition in order to restrain holes, which are stored in the floating body 3, from exiting from unselected cells, thereby reducing the disturbance of the unselected cells. In a fourth condition, a positive voltage $V_g$ and a negative voltage $V_s$ are applied, and 0 V is applied to the remaining electrodes. Accordingly, the holes in the floating body 3 are erased, thus resulting in hole depletion. In a fifth condition, a positive voltage $V_{cg}$ is further applied under the fourth condition, thereby helping hole depletion of the floating body 3. In a sixth condition, a negative voltage $V_{cg}$ is further applied under the fourth condition in order to restrain holes, which are stored in the floating body 3, from exiting from unselected cells, thereby reducing the disturbance of the unselected cells.

In a seventh condition, a positive voltage $V_g$ and negative voltages $V_d$ and $V_s$ are applied so as to erase holes from the floating body 3. In this case, since the holes exit to the source 8 and the drain 9 at the same time, the exit speed is faster than that at the time when the holes exit to either the source 8 or the drain 9. In the seventh condition, the voltage $V_{sub}$ (or $V_{well}$) may be 0 V, and the voltage $V_{cg}$ may be 0 V, negative or positive. In the case where a positive voltage $V_{cg}$ is applied, it helps holes exit from the floating body 3. In the case where a negative voltage $V_{cg}$ is applied, it prohibits holes, stored in the floating body 3 of an unselected cell device, from exiting, thereby reducing the disturbance of the unselected cell device. Eighth to tenth conditions may be applied to 1T-DRAM cell devices having the structure of FIG. 5B. That is, since the control electrode 7 does not exist, the voltage $V_{cg}$ is indicated by "X". The eighth condition is almost similar to the first condition except that the voltage $V_{cg}$ cannot be applied since there is no control electrode. In the ninth condition, a positive voltage $V_g$ and a negative voltage $V_d$ are applied, a positive voltage $V_{sub}$ (or $V_{well}$) is applied, and the voltage $V_s$ has 0 V. The positive voltage $V_{sub}$ or $V_{well}$ helps holes exit well from the floating body 3 in a "write0" operation. In this case, the voltage $V_d$ has 0 V and the voltage $V_s$ is positive, so that the same effect as above can be obtained. In the tenth condition, a positive voltage $V_g$ and a negative voltage $V_d$ are applied, a negative voltage $V_s$ (or $V_{well}$) is applied, and the voltage $V_s$ has 0 V. The negative voltage $V_{sub}$ (or $V_{well}$) restrains holes, which are stored in the floating body 3 of an unselected cell device, from exiting in a "write0" operation, thereby reducing the disturbance of the unselected cell device.

Cell Array Using 1T-DRAM Device

The arrangement of principal regions is described in detail in the case where the 1T floating-body DRAM cell devices described with reference to FIG. 15 according to the present invention are arranged in order to implement a cell array. Operating voltage conditions according to this arrangement are described below. In the drawings, contact regions 14 indicated in the source 8 and the drain 9 or the control electrode 7 are the same, but respective contacts for the source 8, the drain 9 and the control electrode 7 may be separately formed when necessary. This may be also applied to the contact of the gate electrode 11. In FIG. 15, lines (for example: W0, W1, . . . ) beginning with W denote word lines that connect the gate electrodes 11, and lines that connect the control electrodes 7 are indicated by C0, C1, . . . and are referred to as control electrode lines. In FIG. 15, squares represent cell devices symbolically.

With regard to the cell arrays in which 1T-DRAM cell devices are arranged, shown in FIGS. 15A, 15B and 15C, a variety of embodiments related to the arrangement of word lines and control electrode line are described in brief below first.

Figure 15A:
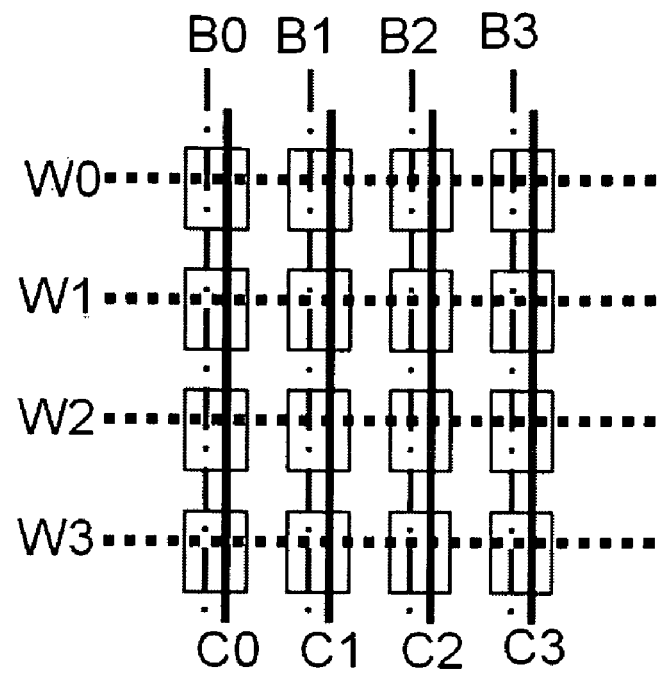
FIGS. 15A to 15C are diagrams showing the directions of connection between control electrode lines (for example, C0, C1, C2, ... ) connecting control electrodes, word lines (for example, W0, W1, W2, ... ) connecting gate electrodes, and bit lines (for example, B0, B1, B2, ... ) connecting the drains of devices in cell arrays using the operation of the 1T-DRAM cell device with the non-volatile function according to the present invention.
Figure 15B:
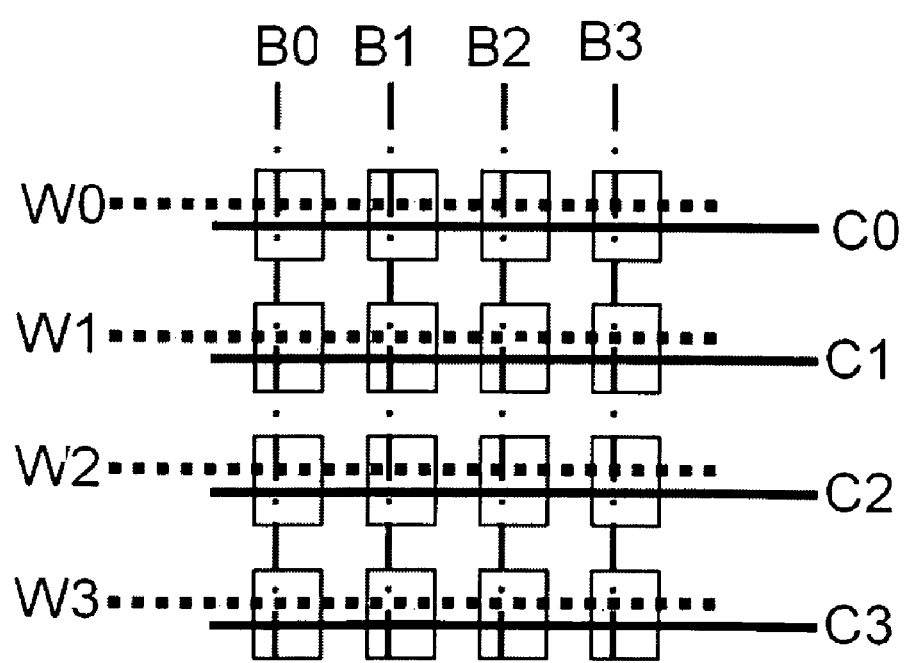
Figure 15C:
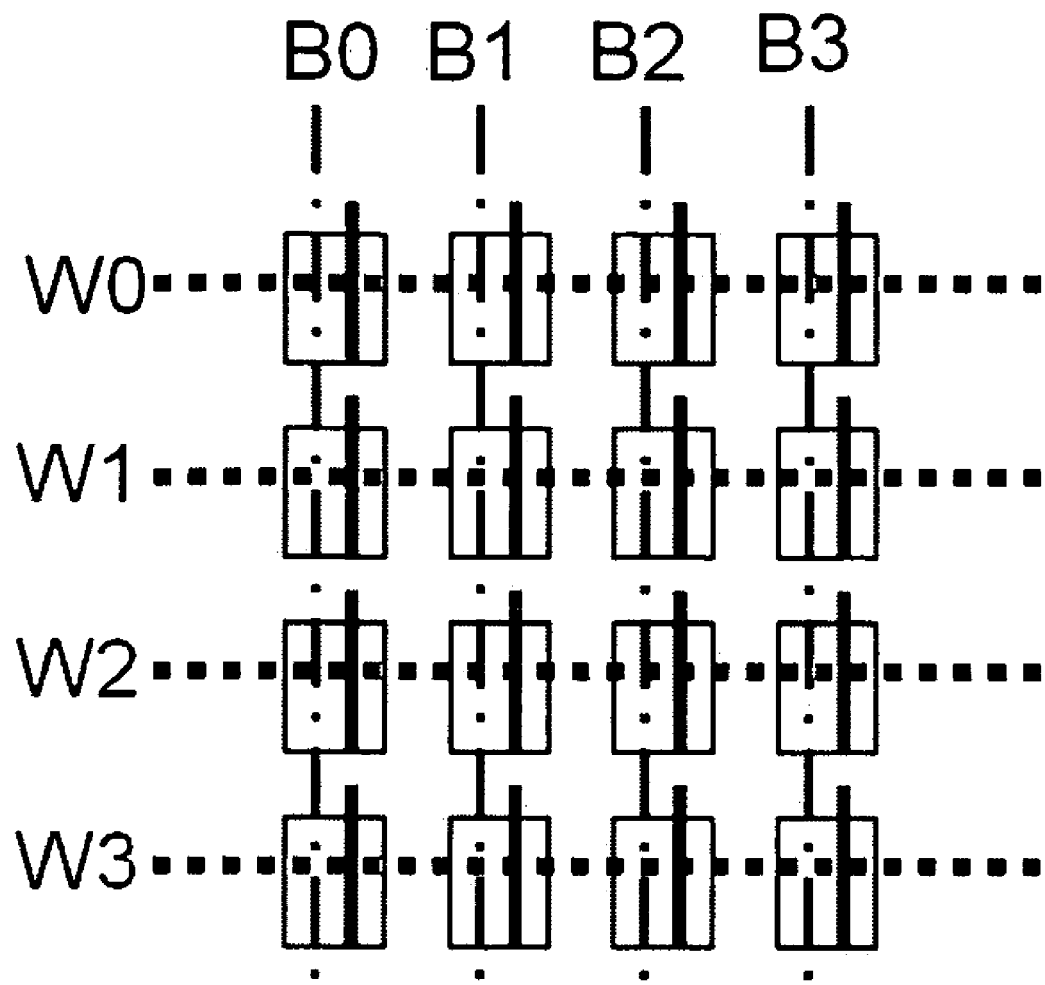

First, in FIG. 15A, the word lines and the control electrode lines intersect each other. Accordingly, with respect to one selected word line and one selected control electrode line, voltages $V_g$ and $V_{cg}$ for a specific operation are simultaneously applied to a cell device at a point where the two lines intersect each other. The voltage $V_g$ is commonly applied to cell devices arranged in a row direction, and the voltage $V_{cg}$ is commonly applied to the control electrodes of cell devices arranged in a column direction. In FIG. 15B, the word lines and the control electrode line are arranged in parallel. Accordingly, voltages $V_g$ and $V_{cg}$ are applied to cell devices arranged in one row at the same time. In FIG. 15C, the word lines are connected in a row direction, and the control electrode lines are formed independently in respective cell devices. Accordingly, if a voltage $V_g$ is applied to one selected row, the voltage is commonly applied to the control electrodes of cell devices arranged in the row. A voltage $V_{cg}$ is independently applied to the control electrode 7 of a specific cell device. In addition, a variety of arrangements is possible, and the voltages $V_g$ and $V_{cg}$ may be applied on a module or line basis. Although not shown in the drawings, the drains or sources of the cell devices may be connected in rows or columns or in module form and the voltage $V_d$ or $V_s$ may be commonly applied thereto.

Now, as an example, the case where bit lines (for example, B0, B1, . . . ) connecting the drains 9 are arranged and a voltage $V_d$ is applied to the drains 9 is described. In this case, the drains 9 of cell devices arranged in columns are connected to the bit lines. Accordingly, if the voltage $V_d$ is applied, the voltage is commonly applied to the drains 9 of cell devices arranged in columns. Additionally, a variety of arrangements are possible, and voltages $V_g$, $V_{cg}$, and $V_d$ may be applied on a module or line basis. Moreover, although not shown in the drawings, the sources 8 of the cell devices may be connected in rows or columns or in module form and voltage may be commonly applied thereto.

As described above, the present invention constructed as described above provides a 1T-DRAM cell device and a 1T-DRAM cell device array, which operate using a non-volatile function in a dual gate 1T-DRAM cell device. The reduction in the size of a device can be easily achieved and the device performance can be improved through an operation method using the non-volatile function. By controlling the voltage of a control electrode, a substrate or a well, the difference in the drain current in the states "write1" and "write0" of a 1T-DRAM cell device can be increased and the retention characteristic of the cell device can be improved. Furthermore, the threshold voltage distribution can be reduced by controlling the quality of electric charges stored in the charge storage node, the integration level of cell arrays can be improved by adequately sharing control electrodes, and the performance of DRAM can be enhanced by adding the non-volatile memory function to a 1T-DRAM cell device operation.

Figure 16:
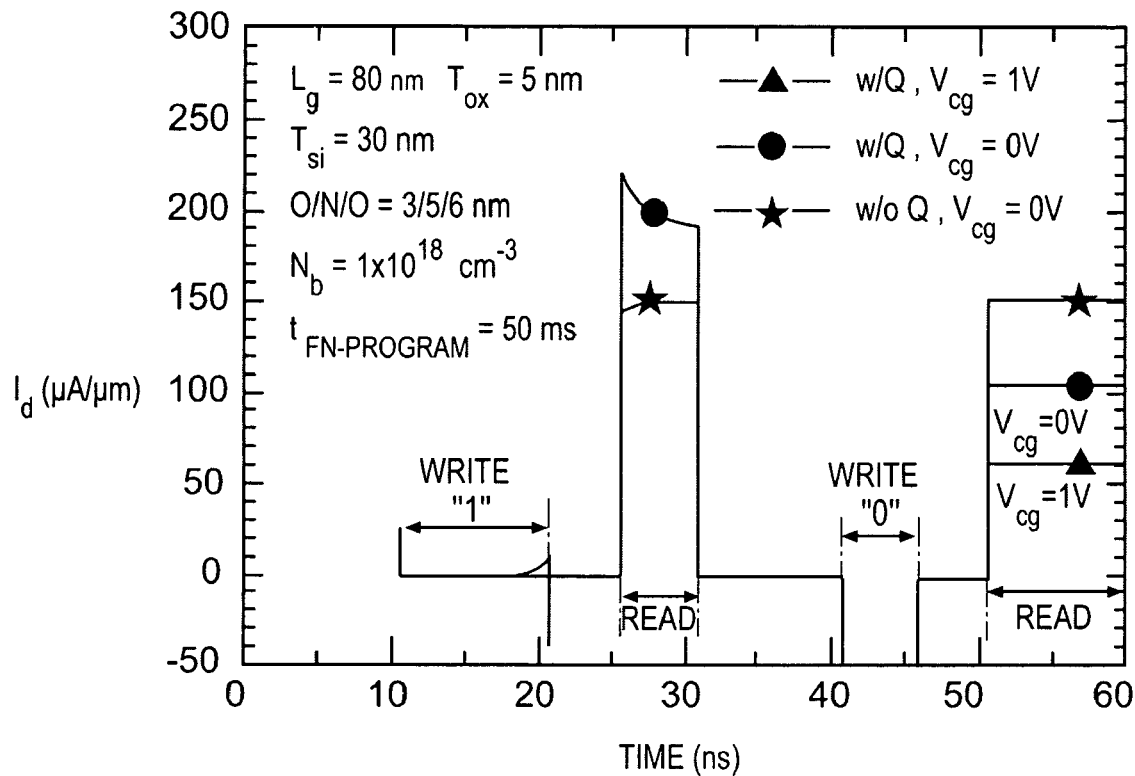
FIG. 16 is a graph showing the characteristics of the device according to various operating voltage conditions in the 1T-DRAM cell device having a dual gate structure according to the present invention.

FIG. 16 is a graph showing the characteristics of a device according to three operating voltage conditions in the 1T-DRAM cell device having a dual gate structure according to the present invention. In FIG. 16, "w/o Q, $V_{CG}$=0 V" simply indicates only a conventional dual gate operation, and is indicated by a star symbol. "w/Q, $V_{CG}$=0 V" indicates that, in the dual gate structure according to the present invention, electrons are stored in the charge storage node 5 and operate in the program state of the non-volatile function, and is indicated by a circle symbol. An indication by the star symbol simply results from a conventional dual gate having a fully depleted floating body. It can be seen that there is almost no current difference in the read operation after "write1" and "write0". Accordingly, from FIG. 16, it can be easily seen that the conventional dual gate has almost no sensing margin if the floating body is fully depleted. In the 1T-DRAM cell device having a dual gate structure according to the present invention, if a voltage of −1 V is applied to the control electrode 7 during the "write1" and "write0" operations, the sensing margin is improved as indicated by a triangle symbol. In this case, since the voltage −1 V must be continuously applied to the control electrode 7, the problem of increased power consumption or short circuit may occur. If according to the present invention, the non-volatile function is added to the 1T-DRAM cell device having a dual gate structure and the voltage of the control electrode 7 is fixed to 0 V, there is achieved sensing margin similar to that in the case where only the voltage of the control electrode 7 in the dual gate is controlled. In this method, the degree of integration can be improved significantly because it is not necessary to electrically isolate the control electrodes 7 of all cell devices. If the voltage of a control electrode is controlled in each operation region in addition to the results of "w/Q, $V_{CG}$=0 V" in which the non-volatile memory function is added to the dual gate, a further improved sensing margin can be achieved.

The present invention is intended to a 1T-DRAM cell device with a non-volatile function and an operation method for an array, and enables the implementation of high-integration and high-performance DRAM. It is expected that the application of 1T-DRAM cell devices having an improved degree of integration and improved performance will be increased in the field of System on Chips (SoCs) or DRAM. As a result, the present invention can be widely used in embedded DRAM including a one transistor with a non-volatile function and the operation of DRAM.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Furthermore, it should be construed that differences pertinent to such modifications and applications fall within the scope of the present invention defined in the claims.

What is claimed is:

1. A one-transistor (1T) floating-body Dynamic Random Access Memory (DRAM) cell device having a dual gate structure, the 1T floating-body DRAM cell device comprising:
   a floating body which stores information in the DRAM cell device;
   a source and a drain formed on respective sides of the floating body;
   a gate insulating layer formed on the floating body;
   a gate electrode formed on the gate insulating layer;
   a gate stack formed under the floating body, the gate stack including a charge storage node which stores electric charges; and
   a control electrode partially or completely surrounded by the gate stack, the charge storage node completely surrounding the control electrode;
   wherein the DRAM cell device performs "write0" and "write1" operations by storing information in the floating body or a read operation by reading the information stored in the floating body; or
   wherein the DRAM cell device performs a non-volatile program operation by storing electric charges in the charge storage node of the gate stack or a non-volatile erase operation by erasing the electric charges stored in the charge storage node.

2. The 1T floating-body DRAM cell device as set forth in claim 1, wherein:
   the gate stack is formed on a semiconductor substrate and further comprises a substrate electrode for applying voltage to the semiconductor substrate; and
   voltage of the substrate electrode is controlled during the non-volatile program operation or non-volatile erase operation on the charge storage node or the "write0", "write1" and read operation on the floating body.

3. The 1T floating-body DRAM cell device as set forth in claim 1, wherein, before, after or during the "write0", "write1" and "read" operations on the floating body, the non-volatile program operation or the non-volatile erase operation is performed by controlling voltage of the control electrode.

4. The 1T floating-body DRAM cell device as set forth in claim 2, wherein the non-volatile program operation and the non-volatile erase operation are performed using one selected from the group consisting of a Fowler-Nordheim (FN) method, a hot electron injection method, and a hot hole injection method or a combination thereof.

5. The 1T floating-body DRAM cell device as set forth in claim 1, wherein information about "write1" and "write0" stored in the floating body is stored in the charge storage node of the gate stack as non-volatile information by performing the non-volatile program operation and the non-volatile erase operation.

6. The 1T floating-body DRAM cell device as set forth in claim 1, wherein:
   after the non-volatile program operation or the non-volatile erase operation have been performed, a preset voltage is uniformly applied to the control electrode during a DRAM operation "write" or "read"; and
   the applied voltage is 0 V, negative (−) or positive (+) DC voltage, or voltage in pulse form.

7. The 1T floating-body DRAM cell device as set forth in claim 1, wherein, when the non-volatile program operation and the non-volatile erase operation are performed by applying a preset voltage to the control electrode, a polarity and magnitude of the electric charges stored in the charge storage node is controlled by adjusting a polarity, magnitude and duration of the voltage applied to the control electrode.

8. The 1T floating-body DRAM cell device as set forth in claim 1, wherein, when the charge storage node of the gate stack is formed of an insulating thin film or nano-sized dots, non-volatile information is locally stored in the charge storage node by performing the non-volatile program operation or the non-volatile erase operation using a hot carrier method.

9. The 1T floating-body DRAM cell device as set forth in claim 2, wherein, when the control electrode exists in a floating state, the non-volatile program operation and the non-volatile erase operation are performed by controlling voltage applied to the substrate electrode or voltage applied to a well additionally formed in the substrate.

10. The 1T floating-body DRAM cell device as set forth in claim 2, wherein the non-volatile program operation and the non-volatile erase operation are performed by controlling voltage applied to the control electrode and the substrate electrode or voltage applied to the control electrode and a well additionally formed in the substrate.

11. The 1T floating-body DRAM cell device as set forth in claim 2, wherein the non-volatile program operation and the non-volatile erase operation are performed by controlling voltage applied to one or two or more of the source, the drain, and the substrate while applying voltage to the control electrode.

12. The 1T floating-body DRAM cell device as set forth in claim 2, wherein:
   the semiconductor substrate further comprises a well-shaped well electrode;
   the well electrode is electrically isolated from the semiconductor substrate; and
   voltage is applied to the semiconductor substrate through the well electrode during the non-volatile program operation and the non-volatile erase operation on the gate stack or a program operation and a read operation on the DRAM.

13. The 1T floating-body DRAM cell device as set forth in claim 1, wherein the "write1" operation for storing information corresponding to "write1" in the floating body is performed by applying a voltage, preset to a value corresponding to "write1", to the gate electrode and the drain, a voltage, preset to a value corresponding to "write1", to the control electrode and the drain, or a voltage, preset to value corresponding to "write1", to the gate electrode, the control electrode and the drain.

14. The 1T floating-body DRAM cell device as set forth in claim 1, wherein the "write0" operation for storing information corresponding to "write0" in the floating body is performed by applying a voltage, preset to a value corresponding to "write0", to the gate electrode and the drain, a voltage, preset to a value corresponding to "write0", to the control electrode and the drain, a voltage, preset to a value corresponding to "write0", to the gate electrode, the control electrode, and the drain, or a voltage, preset to a value corresponding to "write0", to the source.

15. The 1T floating-body DRAM cell device as set forth in claim 1, wherein the read operation for reading the information stored in the floating body is performed by applying voltage, preset to a value corresponding to "read", to the gate electrode and the drain, voltage, preset to a value corresponding to "read", to the control electrode and the drain, or voltage, preset to a value corresponding to "read", to the gate electrode, the control electrode, and the drain.

16. The 1T floating-body DRAM cell device as set forth in claim 1, wherein:
the gate electrode, and the source/drain are formed so that the gate electrode does not overlap the source/drain; and
the "write1" operation performed on the floating body is performed by controlling voltage of the gate electrode and the drain so that impact ionization is generated in a region between an outside of a channel of the device and the drain.

17. The 1T floating-body DRAM cell device as set forth in claim 1, wherein the non-volatile program operation and the non-volatile erase operation are performed by injecting or removing electric charges into or from the charge storage node of the gate stack through one of the source and the drain, or simultaneously injecting or removing electric charges into or from the charge storage node of the gate stack through the source and the drain.

18. A DRAM cell array having 1T floating-body DRAM cell devices that are repeatedly arranged in rows and columns, wherein:
each of the 1T floating-body DRAM cell devices comprises:
a floating body which stores information of the DRAM cell device;
a source and a drain formed on respective sides of the floating body;
a gate insulating layer formed on a top of the floating body;
a gate electrode formed on a top of the gate insulating layer;
a gate stack formed under the floating body, the gate stack including a charge storage node which stores electric charges; and
a control electrode partially or completely surrounded by the gate stack, the charge storage node completely surrounding the control electrode,
wherein the DRAM cell device performs "write0" and "write1" operations by storing information in the floating body or a read operation by reading the information stored in the floating body; or
wherein the DRAM cell device performs a non-volatile program operation by storing electric charges in the charge storage node of the gate stack or a non-volatile erase operation by erasing the electric charges stored in the charge storage node; and
the DRAM cell array comprises:
word lines configured to connect the gate electrodes of the DRAM cell devices;
bit lines configured to connect the drain electrodes of the DRAM cell devices; and
control electrode lines configured to connect the control electrodes of the DRAM cell devices;
wherein the control electrode lines are arranged in parallel to the word lines or the bit lines.

19. The DRAM cell array as set forth in claim 18, wherein:
each of the DRAM cell devices constituting the DRAM cell array further comprises a well-shaped well electrode, which is electrically isolated from a substrate, in the substrate; and
the well electrode of each of the DRAM cell devices constituting the DRAM cell array is connected to well electrodes of DRAM cell devices arranged in rows or columns.

20. The 1T floating-body DRAM cell device as set forth in claim 1, wherein:
the control electrode is partially or completely surrounded by the gate stack; and
the control electrode does not overlap one of the source and the drain or both the source and the drain.

21. The 1T floating-body DRAM cell device as set forth in claim 1, wherein:
the gate insulating layer and the gate stack are formed on four sides of the floating body on a basis of a cross section of the device in a channel width direction; and
the gate electrode, the control electrode and an inter-electrode insulating layer are formed in combination on the gate insulating layer and the gate stack.

* * * * *